U S 009543398B2

United States Patent
Laven et al.

(10) Patent No.: US 9,543,398 B2
(45) Date of Patent: Jan. 10, 2017

(54) SEMICONDUCTOR SWITCHING DEVICE INCLUDING CHARGE STORAGE STRUCTURE

(71) Applicant: Infineon Technologies AG, Neubiberg (DE)

(72) Inventors: Johannes Georg Laven, Taufkirchen (DE); Anton Mauder, Kolbermoor (DE); Matteo Dainese, Villach (AT); Franz Hirler, Isen (DE); Christian Jaeger, Munich (DE); Maximilian Roesch, St. Magdalen (AT); Wolfgang Roesner, Ottobrunn (DE); Martin Stiftinger, Stockdorf (DE); Robert Strenz, Radebeul (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/814,758

(22) Filed: Jul. 31, 2015

(65) Prior Publication Data

US 2016/0056251 A1 Feb. 25, 2016

(30) Foreign Application Priority Data

Aug. 21, 2014 (DE) .......... 10 2014 111 981

(51) Int. Cl.
  *H01L 29/423* (2006.01)
  *H01L 27/02* (2006.01)
  (Continued)

(52) U.S. Cl.
  CPC ... *H01L 29/42344* (2013.01); *H01L 21/28273* (2013.01); *H01L 21/28282* (2013.01); *H01L 27/0207* (2013.01); *H01L 27/0623* (2013.01); *H01L 27/11521* (2013.01); *H01L 27/11568* (2013.01); *H01L 27/11573* (2013.01);
  (Continued)

(58) Field of Classification Search
  CPC .......... H01L 29/42344; H01L 29/42352; H01L 29/7813
  See application file for complete search history.

(56) References Cited

U.S. PATENT DOCUMENTS 6,664,587 B2 12/2003 Guterman et al.
8,247,865 B2 8/2012 Hirler
(Continued)

FOREIGN PATENT DOCUMENTS

WO 02/13257 A2 2/2002

*Primary Examiner* — Daniel Shook
(74) *Attorney, Agent, or Firm* — Eschweiler & Associates, LLC

(57) ABSTRACT

A semiconductor switching device includes a first load terminal electrically connected to source zones of transistor cells. The source zones form first pn junctions with body zones. A second load terminal is electrically connected to a drain construction that forms second pn junctions with the body zones. Control structures, which include a control electrode and charge storage structures, directly adjoin the body zones. The control electrode controls a load current through the body zones. The charge storage structures insulate the control electrode from the body zones and contain a control charge adapted to induce inversion channels in the body zones in the absence of a potential difference between the control electrode and the first load electrode.

22 Claims, 23 Drawing Sheets

(51) Int. Cl.
   *H01L 27/06*   (2006.01)
   *H01L 27/115*  (2006.01)
   *H01L 29/792*  (2006.01)
   *H01L 21/28*   (2006.01)
   *H01L 29/788*  (2006.01)

(52) U.S. Cl.
   CPC .... *H01L 29/4234* (2013.01); *H01L 29/42324* (2013.01); *H01L 29/7883* (2013.01); *H01L 29/792* (2013.01); *H01L 27/11556* (2013.01); *H01L 27/11582* (2013.01)

(56) References Cited

U.S. PATENT DOCUMENTS

2003/0173619 A1    9/2003  Feldtkeller et al.
2004/0032762 A1*   2/2004  Blanchard ......... H01L 21/28273
                                                      365/159

* cited by examiner

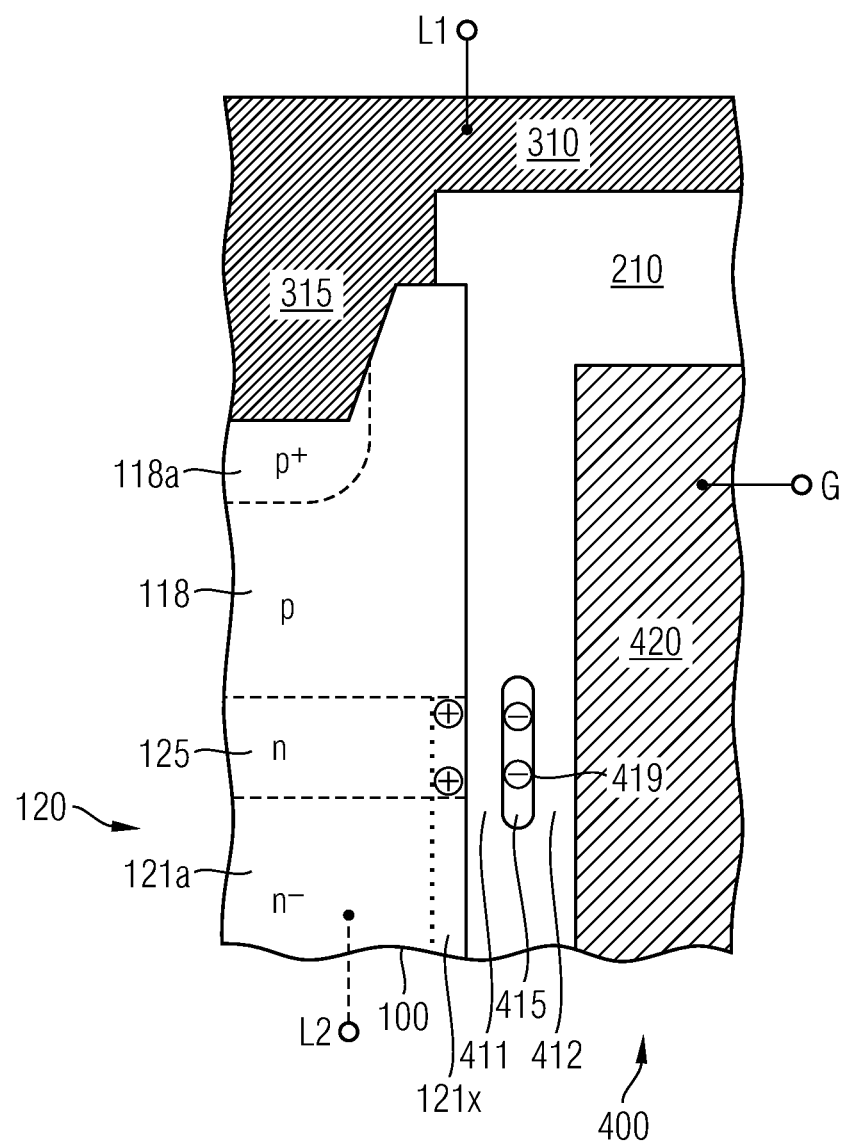

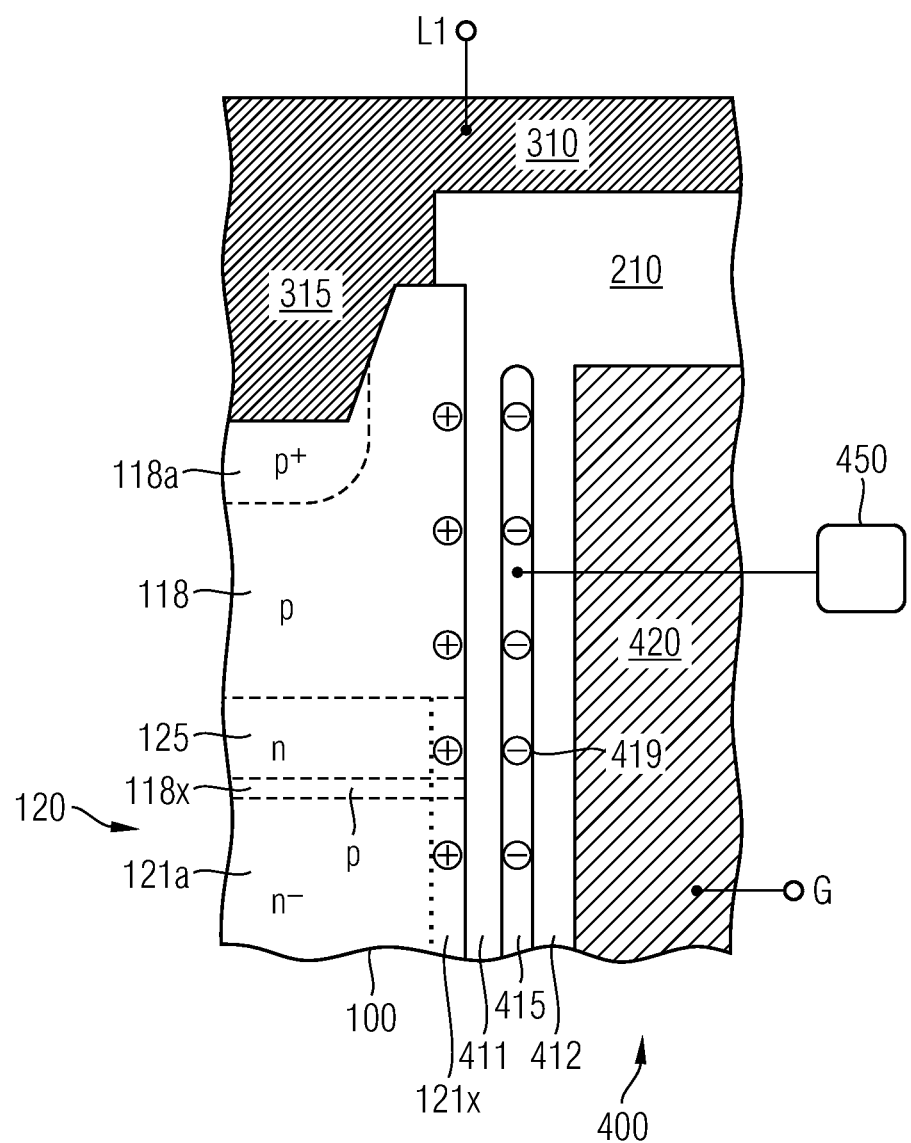

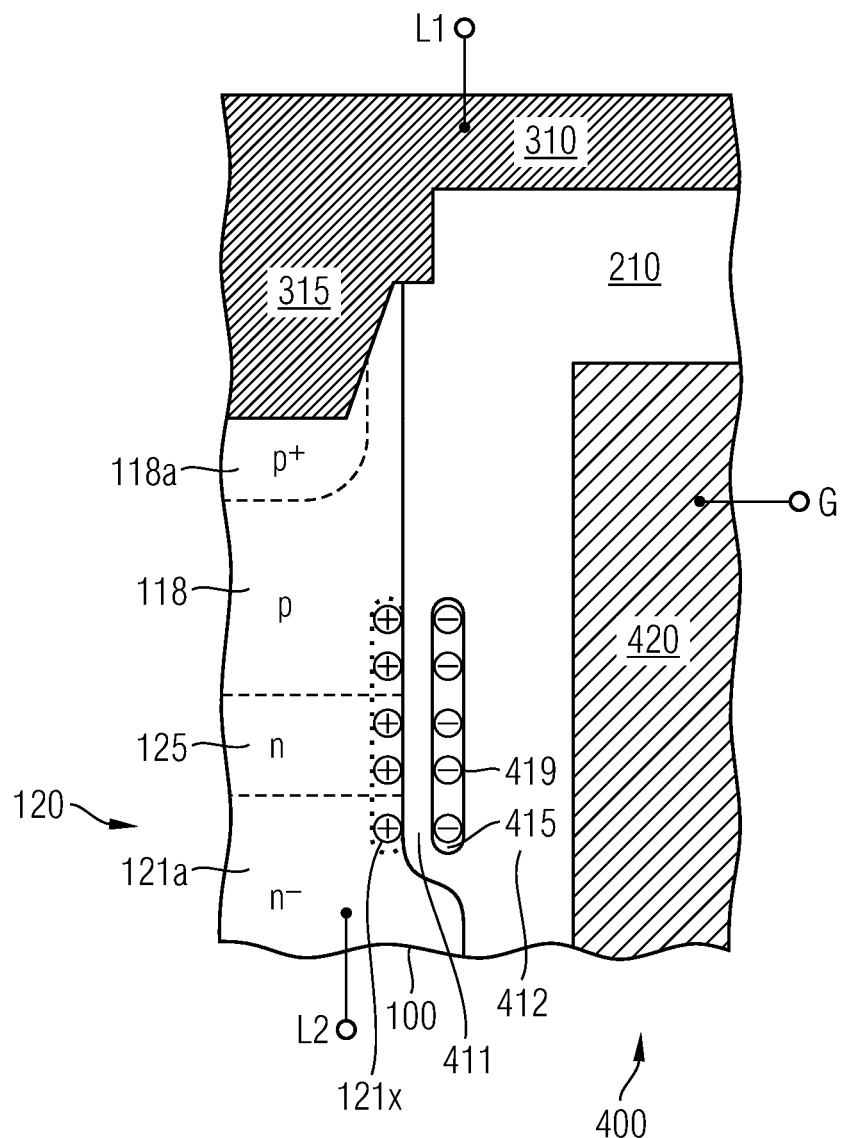

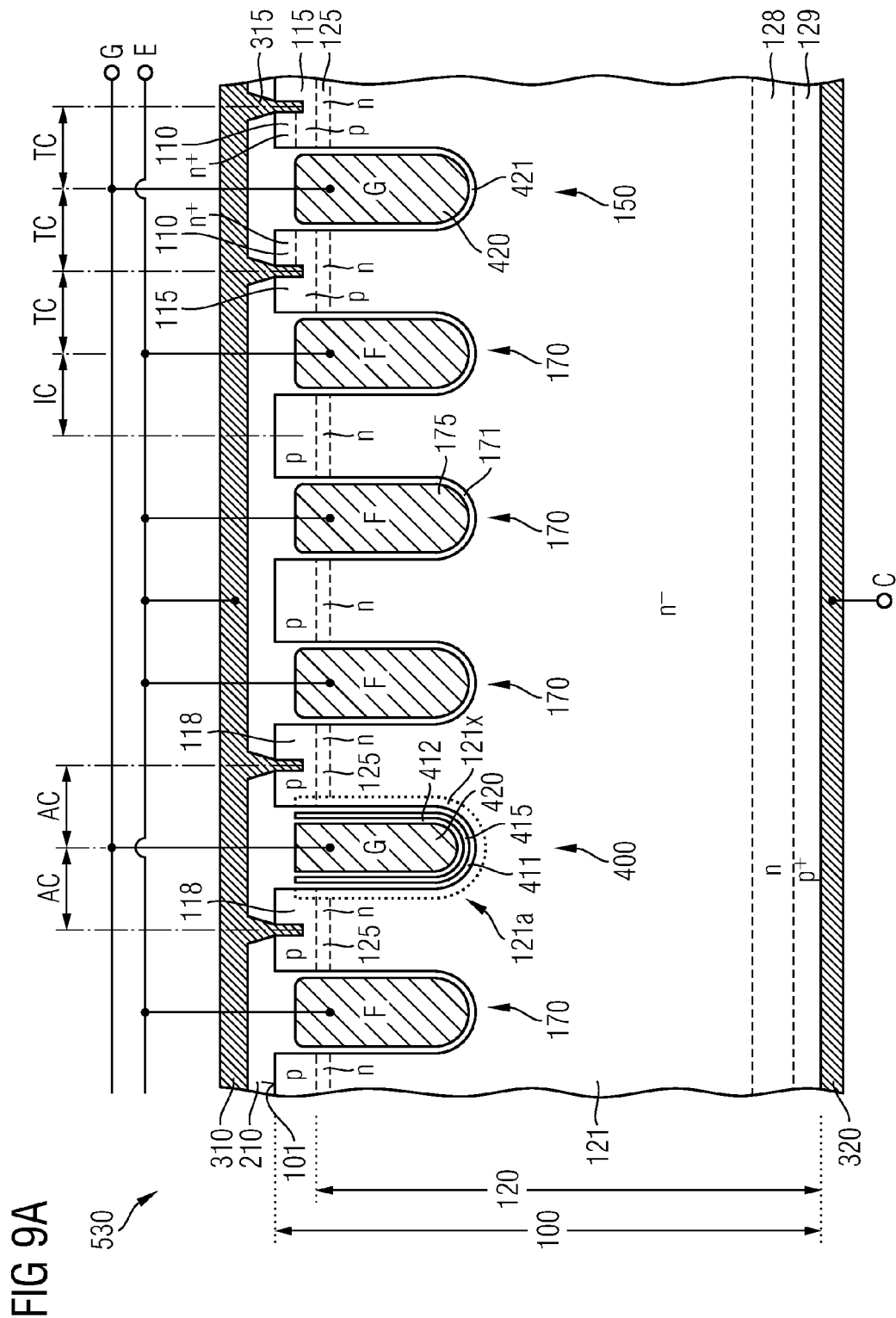

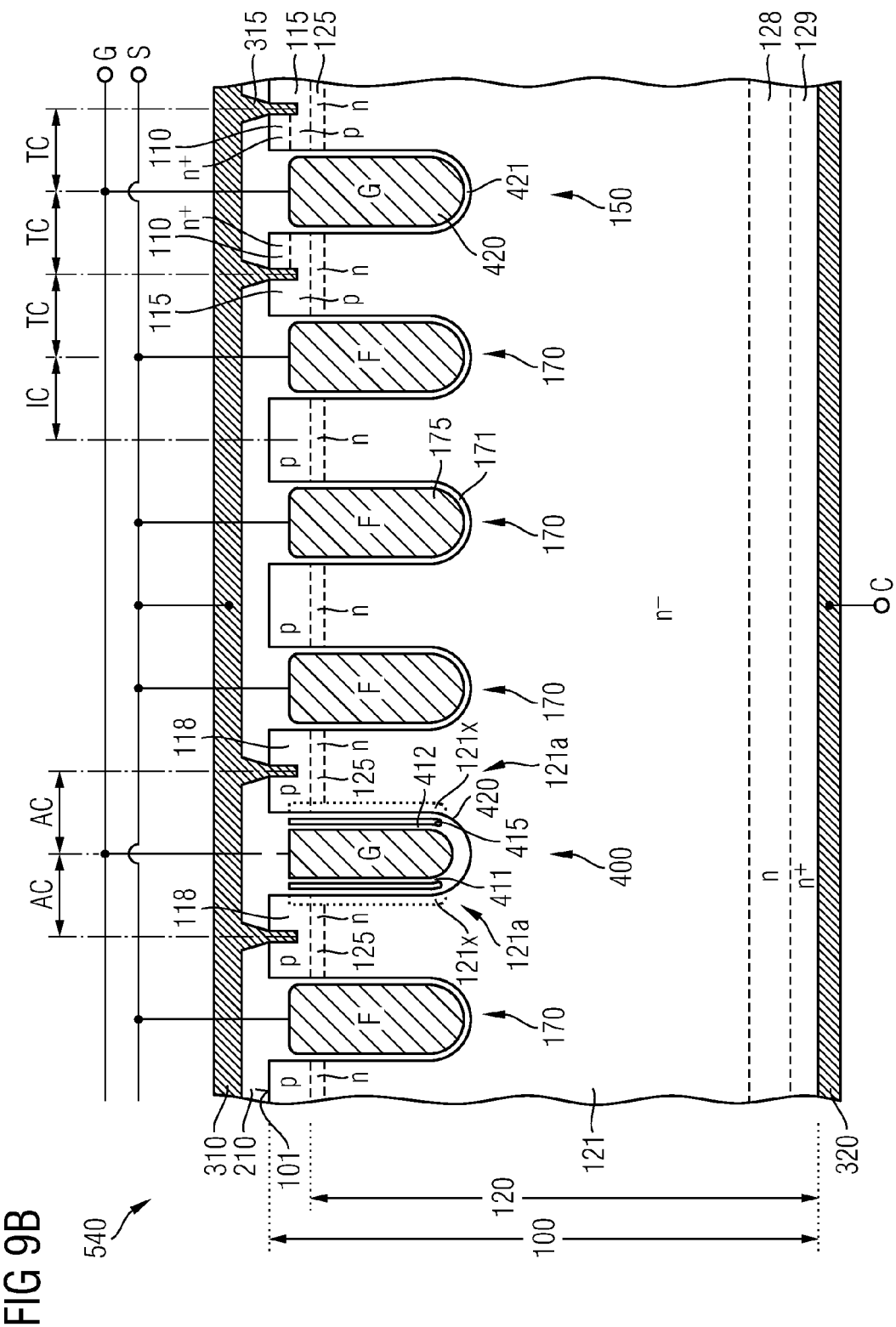

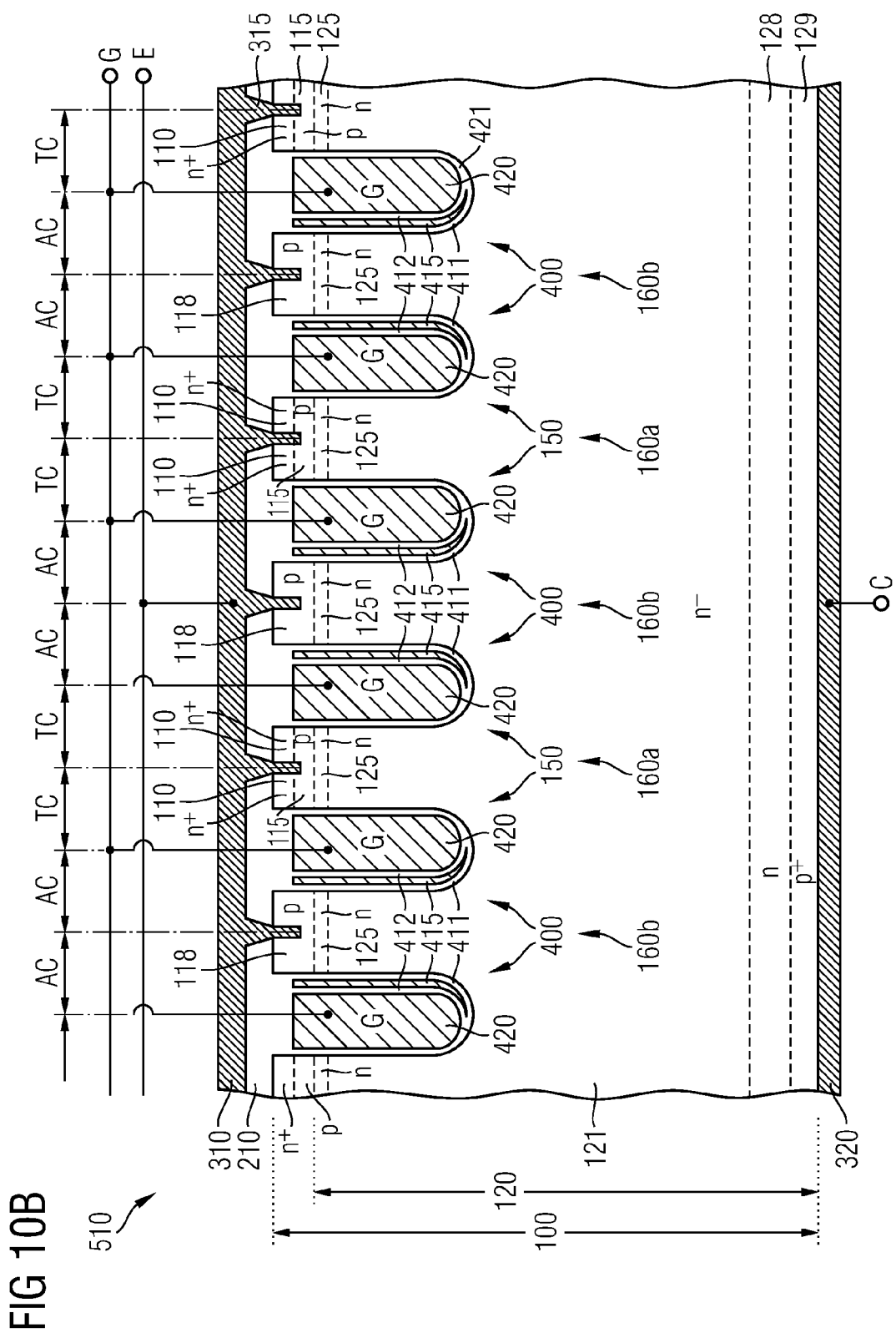

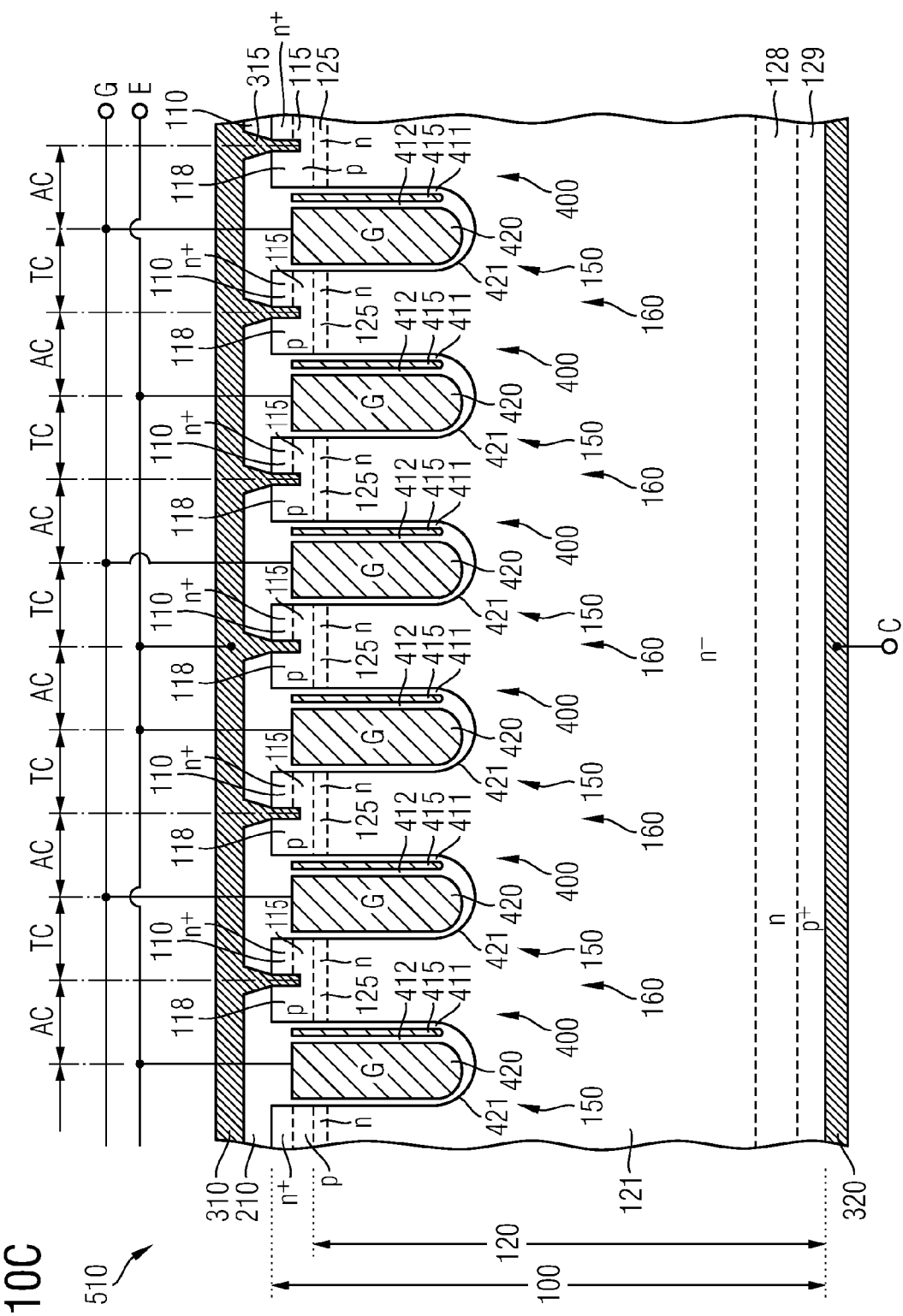

SEMICONDUCTOR SWITCHING DEVICE INCLUDING CHARGE STORAGE STRUCTURE

CROSS REFERENCE TO RELATED APPLICATIONS

This application claims priority to German Application No. 102014111981.9, filed on Aug. 21, 2014, and incorporated herein by reference in its entirety.

BACKGROUND

Power semiconductor switching devices are either normally-on devices conducting a load current in the absence of a potential difference between gate and source or normally-off devices which do not conduct a load current in the absence of a potential difference between gate and source. Inter alia for safety reasons normally-off switching devices are more popular. On the other hand in some applications, such as cascode circuits, normally-on switching semiconductor devices can reduce circuit complexity.

Further in the field of power semiconductor switching devices a desaturation cycle may partly reduce a charge carrier plasma before switching the semiconductor switching device from an on-state to a blocking state.

SUMMARY

It is an object to provide normally-on semiconductor switching devices as well as desaturable semiconductor switching devices with improved device characteristics.

According to an embodiment a semiconductor switching device includes a first load terminal electrically connected to source zones of transistor cells. The source zones form first pn junctions with body zones. A second load terminal is electrically connected to a drain construction that forms second pn junctions with the body zones. Control structures, which include a control electrode and charge storage structures, directly adjoin the body zones. The control electrode controls a load current through the body zones. The charge storage structures insulate the control electrode from the body zones and contain a control charge adapted to induce inversion channels in the body zones in the absence of a potential difference between the control electrode and the first load electrode.

According to another embodiment a semiconductor switching device includes transistor cells that include source zones forming first pn-junctions with body zones. The body zones form second pn-junctions with a drain construction. Auxiliary cells include charge carrier transfer zones that form third pn-junctions with desaturation portions of the drain construction. A first control structure includes a first portion of a control electrode and induces an inversion channel through the body zones in an on-state. A second control structure directly adjoins the desaturation portions of the drain construction. The second control structure includes a second portion of the control electrode and a charged layer sandwiched between the second portion of the control electrode and the desaturation portions. The charged layer contains a control charge adapted to induce an inversion layer in the desaturation portions in the on-state.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 8A is a schematic cross-sectional view of a portion of a semiconductor switching device in accordance with an embodiment relating to charges trapped in a dielectric charge trapping layer of a desaturable semiconductor switching device.

FIG. 8B is a schematic cross-sectional view of a portion of a semiconductor switching device in accordance with an embodiment related to a conductive charge storage layer of a desaturable semiconductor switching device.

FIG. 8D is a schematic cross-sectional view of a portion of a semiconductor switching device in accordance with an embodiment related to a charged layer outside a main trench.

FIG. 9A is a schematic cross-sectional view of a portion of a semiconductor switching device in accordance with an embodiment related to a desaturable IGBT.

FIG. 9B is a schematic cross-sectional view of a portion of a semiconductor switching device in accordance with an embodiment related to a desaturable IGFET.

FIG. 10B is a schematic cross-sectional view of a portion of a semiconductor switching device in accordance with an embodiment related to a layout with pairs of mirror-inverted auxiliary cells and pairs of mirror-inverted transistor cells.

FIG. 10C is a schematic cross-sectional view of a portion of a semiconductor switching device in accordance with an embodiment related to a layout with asymmetric control structures.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
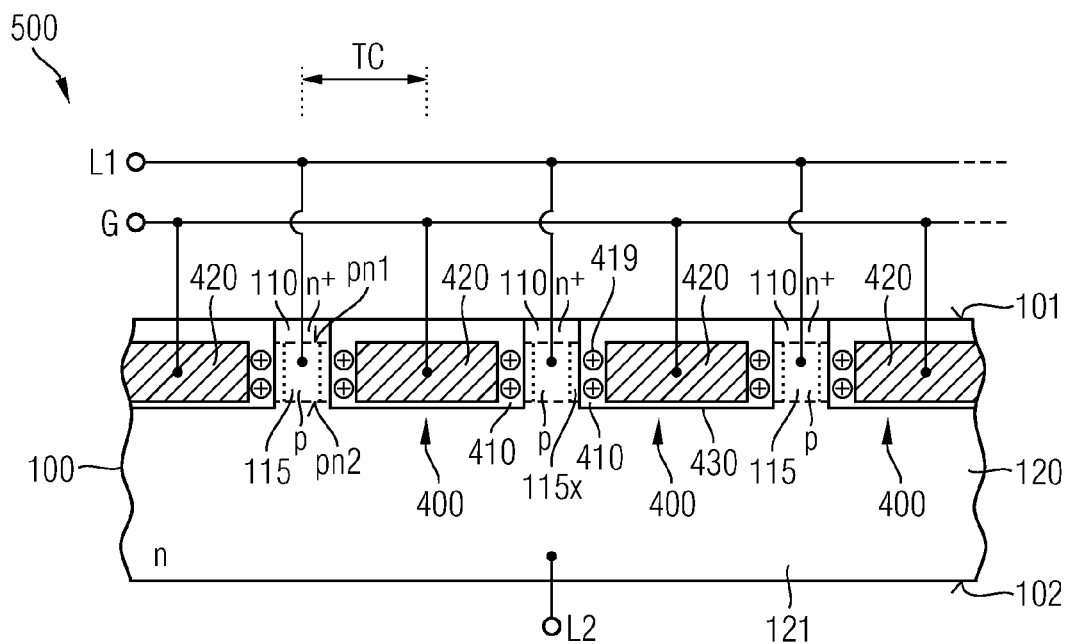
FIG. 1A is a schematic cross-sectional view of a portion of a semiconductor switching device for illustrating effects of embodiments concerning normally-on semiconductor switching devices.

FIG. 1A refers to a semiconductor switching device 500 including active transistor cells TC, for example an IGFET (insulated gate field effect transistor), such as an MOSFET (metal oxide semiconductor FETs) in the usual meaning including FETs with metal gates as well as FETs with non-metal gates.

The semiconductor switching device 500 is based on a semiconductor body 100 from a single-crystalline semiconductor material such as silicon (Si), silicon carbide (SiC), germanium (Ge), a silicon-germanium crystal (SiGe), gallium nitride (GaN), gallium arsenide (GaAs) or any other $A_{III}B_V$ semiconductor. The semiconductor body 100 has a first surface 101 which may be approximately planar or which may be defined by a plane spanned by coplanar surface sections, as well as a planar second surface 102 parallel to the first surface 101. A perpendicular to the first surface 101 defines a vertical direction and directions orthogonal to the vertical direction are horizontal directions. In a horizontal plane the semiconductor body 100 may have a rectangular shape with an edge length in the range of several millimeters or may be disc-shaped with a diameter of several centimeters.

The semiconductor body 100 includes source zones 110 of a first conductivity type that may directly adjoin the first surface 101. The source zones 110 form first pn junctions pn1 with body zones 115 having a second, complementary conductivity type. A first load terminal L1 is electrically connected to the source zones 110 and the body zones 115. The body zones 115 form second pn junctions pn2 with a drain construction 120 and separate the source zones 110 from the drain construction 120. The drain construction 120 is electrically connected to a second load terminal L2.

The drain construction 120 includes a drift zone 121 of the first conductivity type. A dopant concentration in the drift zone 121 may gradually or in steps increase or decrease with increasing distance to the first surface 101 at least in portions of its vertical extension. According to other embodiments, the dopant concentration in the drift zone 121 may be approximately uniform. A mean dopant concentration in the drift zone 121 may be between 5E12 cm$^{-3}$ and 5E17 cm$^{-3}$, for example in a range from 5E13 cm$^{-3}$ to 5E16 cm$^{-3}$. The drain construction 120 may include further doped zones of both conductivity types, for example a superjunction structure, a field stop layer, barrier zones, counter-doped islands and/or a heavily doped contact layer, whose dopant concentration is sufficiently high to form an ohmic contact with a metal directly adjoining the second surface 102.

Control structures 400 directly adjoin the body zones 115. At least one control structure 400 includes a control electrode 420 and a charge storage structure 410.

The control electrode 420 may be electrically coupled or connected to a gate terminal G of the semiconductor device 500. The control electrode 420 may include or consist of a heavily doped polycrystalline silicon layer or a metal-containing layer, for example a metal silicide, or a layer containing or consisting of tantalum, tantalum nitride, titanium, titanium nitride, or tungsten. The control electrode 420 is capacitively coupled to the body zones 115 such that in channel portions 115x of the body zones 115 inversion channels may be switched on and off by varying a potential applied between the gate terminal G and the first load terminal L1. Through the inversion channels a load current flows between the first and second load terminals L1, L2 in an on state of the semiconductor device 500. Control dielectrics 430 may insulate the control electrodes 420 from further portions of the semiconductor body 100 such that the control electrodes 420 are completely insulated from the semiconductor body 100.

The charge storage structures 410 are sandwiched between the body zones 115 and the control electrodes 420 and insulate the control electrodes 420 from the body zones 115. A vertical extension of the charge storage structure 410 may be equal to or greater than the vertical extension of the corresponding body zone 115. The charge storage structure 410 contains charge carriers of a type corresponding to the majority charge carrier type in the body zones 115. For example, for p-type body zones 115 the charge carriers trapped or stored in the charge storage structure 410 are holes. The amount of the control charge 419 in the charge storage structure 410 is sufficiently high such that a load current flows with no voltage VGS applied between the gate and first load terminals G, L1.

Figure 1B:
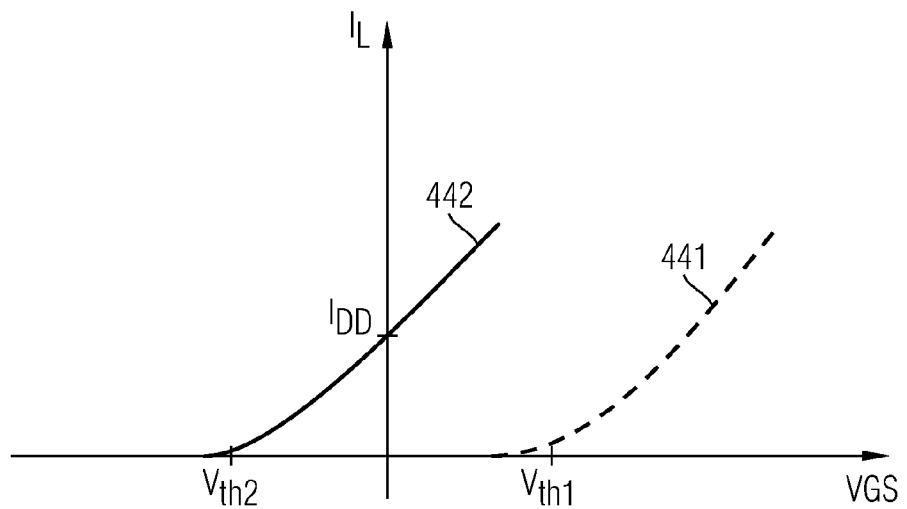
FIG. 1B are schematic IL/VGS characteristics for discussing effects of embodiments concerning normally-on semiconductor switching devices.

In FIG. 1B the IL/VGS characteristic 441 shows the load current IL as a function of the gate-to-source voltage VGS applied between the gate terminal G and the first load terminal L1 of a normally-off semiconductor switching device at a constant drain to source voltage VDS. The normally-off device starts to conduct a load current IL at VGS=Vth1.

The positive control charge 419 in the charge storage structure 410 of the semiconductor switching device 500 biases the control structures 400 such that the semiconductor device 500 of FIG. 1A conducts a load current IL even at VGS=0 as shown by IL/VGS characteristic 442. A negative VGS lower than a second threshold voltage Vth2 must be applied to the control electrode 420 to switch off the semiconductor switching device 500. Though the internal configuration of the semiconductor switching device 500 is that of a normally-off enhancement transistor, the semiconductor switching device 500 behaves like a normally-on depletion transistor.

Conventional normally-on semiconductor switching devices with a channel portion of the same conductivity type as the source zones between the source zones and the drain construction have a lower maximum channel carrier density than normally-off devices with a complementary doped body zone separating the source zone from the drain construction. By contrast, the semiconductor switching device 500 of FIGS. 1A and 1B provides a normally-on characteristic that benefits from the higher maximum channel carrier density of normally-off designs with the body zones 115 having a conductivity type opposite to that of the source zones 110.

FIGS. 2A to 2D refer to details of the charge storage structure 410. A first load electrode 310 electrically connected with the source and body zones 110, 115 may be electrically connected or coupled to the first load terminal L1. The first load electrode 310 may be the source electrode of an IGFET and may consist of or contain, as main constituent(s), aluminum (Al), copper (Cu), or alloys of aluminum or copper, for example AlSi, AlCu or AlSiCu. According to other embodiments the first load electrode 310 may contain, as main constituent(s), nickel (Ni), titanium (Ti), tungsten (W), tantalum (Ta), vanadium (V), silver (Ag), gold (Au), platinum (Pt) and/or palladium (Pd). For example, the first load electrode 310 may include two or more sublayers, e.g. a silicide, a conductive nitride and/or a metal alloy.

A dielectric structure 210 may insulate the first load electrode 310 from the control electrode 420. The dielectric structure 210 may include one or more dielectric layers from silicon oxide, silicon nitride, silicon oxynitride, doped or undoped silicon glass, for example BSG (boron-silicate glass), PSG (phosphorus-silicate glass), or BPSG (boron-phosphorus-silicate glass), by way of example.

Contact structures 315 may extend through openings of the dielectric structure 210 and may electrically connect the first load electrode 310 with the source zones 110 and the body zones 115. The body zones 115 may include heavily doped contact portions 115a for ensuring an ohmic contact between the contact structures 315 and the body zones 115.

Figure 2A:
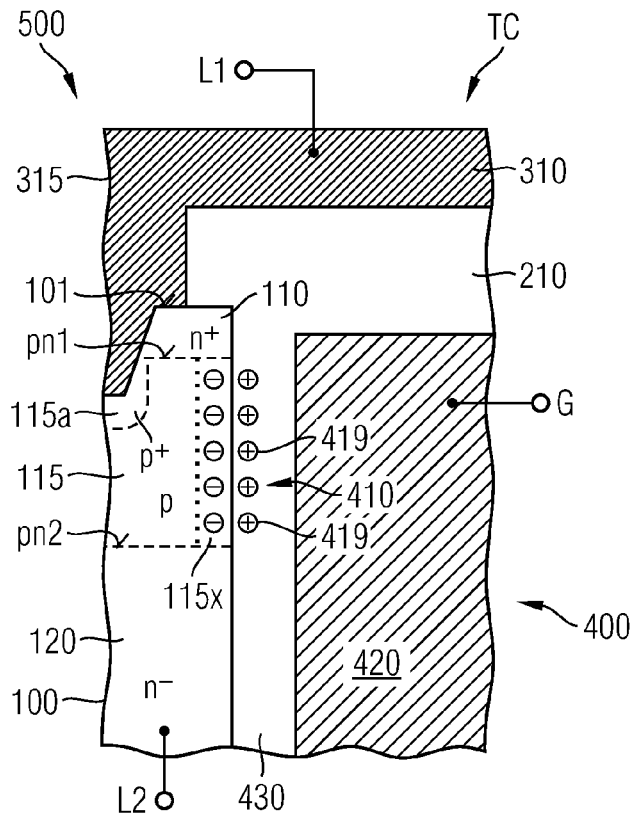
FIG. 2A is a schematic cross-sectional view of a portion of a semiconductor switching device according to an embodiment related to fixed charge carriers in a control dielectric of a normally-on semiconductor switching device.

In FIG. 2A the charge storage structure 410 is a portion of the control dielectric 430 separating the concerned control electrode 420 from surrounding portions of the semiconductor body 100. The charge control structure 410 may include impurity atoms such as cesium (Cs) atoms along the interface between the control dielectric 430 and the body zone 115. The cesium atoms may be the basis of positive charges that are located in molecular layers of the control dielectric 430 adjoining the body zones 115. The impurity atoms may be deposited during the formation of the control dielectric 430.

An areal carrier density of the control charge is equal to or larger than a carrier density obtained by integrating the net dopant concentration in the body zones 115 in horizontal cross-sectional planes. According to an embodiment, an absolute value of the areal carrier density is at least $1E11$ $cm^{-2}$, i.e., at least $1E12$ $cm^{-2}$ or at least $1E13$ $cm^{-2}$. For semiconductor bodies 100 from single-crystalline silicon, the areal carrier density may be between $1E12$ $cm^{-2}$ and $2E12$ $cm^{-2}$, for wide band-gap semiconductors like SiC or GaN, the areal carrier density may be between $1E12$ $cm^{-2}$ and $2E13$ $cm^{-2}$.

The positive control charge 419 induces negative charges in a channel portion 115x of the body zones 115 such that at VGS=0 an electron channel connects the source zone 110 with the drain construction 120. Applying a sufficient negative VGS compensates the control charge 419 and the respective transistor cell TC blocks.

Figure 2B:
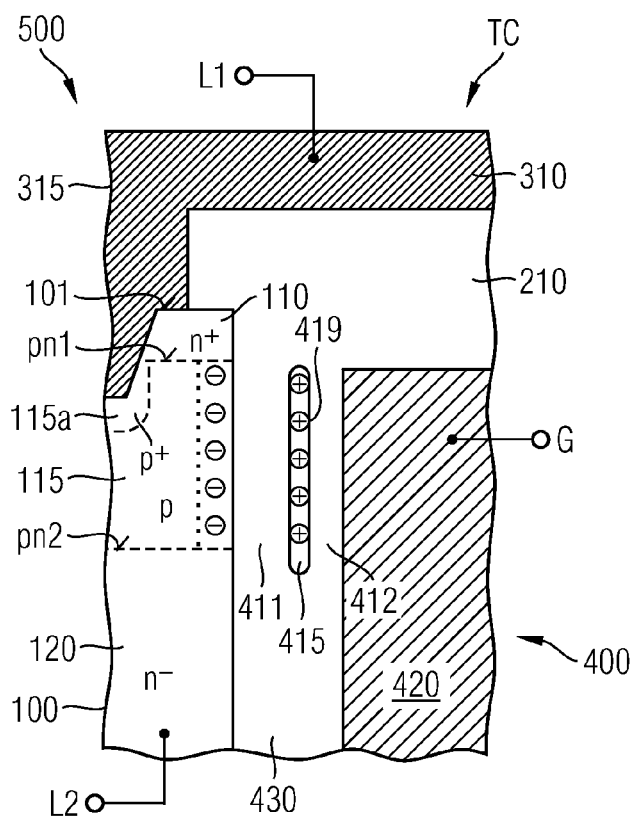
FIG. 2B is a schematic cross-sectional view of a portion of a semiconductor switching device in accordance with an embodiment related to charges trapped in a dielectric charge trapping layer of a normally-on semiconductor switching device.

In FIG. 2B the charge storage structure 410 includes a charge storage layer 415, a first dielectric 411 separating the charge storage layer 415 from the body zone 115 and a second dielectric 412 separating the charge storage layer 415 from the control electrode 420. According to an embodiment, the charge storage layer 415 is a dielectric trapping layer based on a silicon nitride layer. The first and second dielectric layers 411, 412 may be silicon oxide layers.

The control charge 419 is trapped on the charge carrier layer 415. The charge carrier layer 415 may be charged in a program step using Fowler-Nordheim tunneling or hot hole injection.

For example, a program voltage may be applied between the gate terminal G and the first load terminal L1 such that holes may direct tunnel from either the control electrode 420 or the body zone 115 to the charge storage layer 415. According to another embodiment, a first program voltage may be applied between the first and second load terminals L1, L2, such that holes are accelerated in the body zone 115 and/or in the drift zone 121 in a vertical direction and an additional electric field applied between the body zones 115 and/or the drift zone 121 and the control electrodes 420 deflects the accelerated holes such that they reach the charge storage layer 415.

Figure 2C:
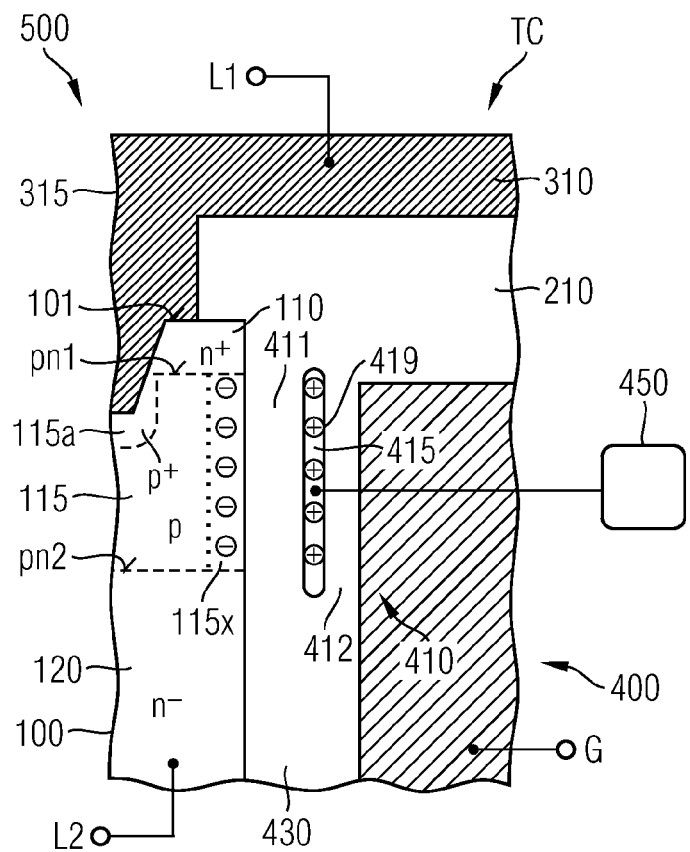
FIG. 2C is a schematic cross-sectional view of a portion of a semiconductor switching device in accordance with an embodiment related to a conductive charge storage layer of a normally-on semiconductor switching device.

In FIG. 2C the charge storage layer 415 is a conductive charge storage layer or "floating gate". A first dielectric 411 separates the charge storage layer 415 from the body zones 115 and a second dielectric 412 insulates the charge storage layer 415 from the control electrode 420.

The charge storage layer 415 may be or may contain a heavily doped polycrystalline semiconductor material and may be charged by using Fowler-Nordheim tunneling or hot hole injection as described above with regard to FIG. 2B. According to another embodiment a wiring structure connects the charge storage layers 415 with a programming pad 450, which may be located on or in the finalized semiconductor switching device 500. According to a further embodiment the wiring structures connects the conductive charge storage layers 415 with each other and temporarily, during a manufacturing phase, with a programming pad 450 outside the finalized semiconductor device 500, for example in a kerf area of a semiconductor wafer from which the semiconductor body 100 of the semiconductor switching device 500 is obtained. In a program step performed after formation of the transistor cells TC, a charge source may be temporarily connected with the programming pad 450 and charges the conductive charge storage layers 415. Then the semiconductor device 500 is separated from a structure including the programming pad 450 and an interruption of the wiring structure may be sealed at the device side. As a result, the control charge 419 is trapped on the completely insulated conductive charge storage layers 415.

According to a further embodiment, the programming pad 450 is not directly accessible but dielectrically insulated from a further electrode. The program step is performed by applying a voltage to the further electrode and using Fowler-Nordheim tunneling or hot carrier injection via the further dielectric, which insulates the programming pad 450 from the further electrode. Both the programming pad 450 and the connected charge storage layers 415 can be fully isolated.

Figure 2D:
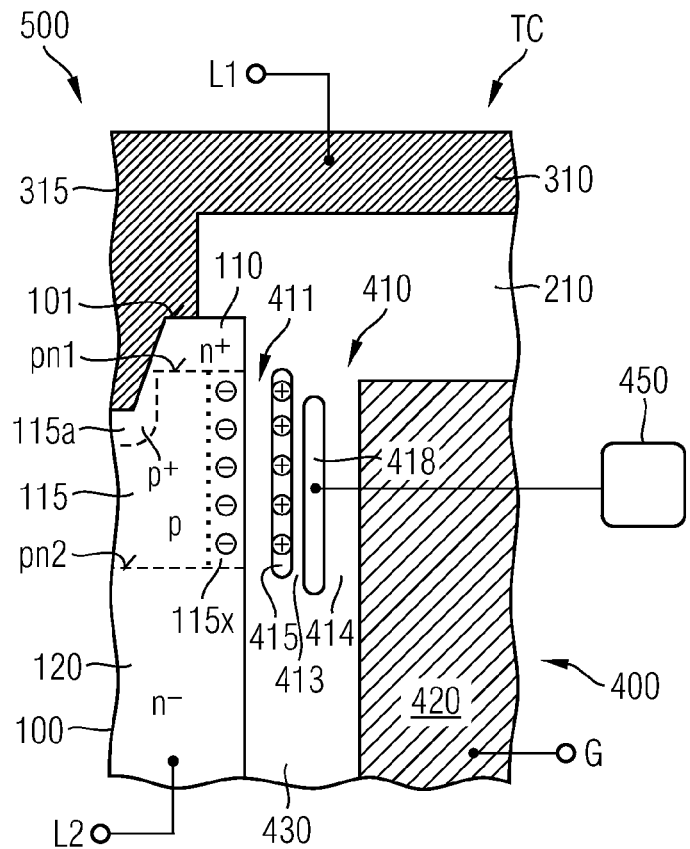
FIG. 2D is a schematic cross-sectional view of a portion of a semiconductor switching device in accordance with an embodiment concerning normally-on semiconductor switching devices including a program electrode.

In FIG. 2D, the charge storage layer 415 include a dielectric charge trapping layer or a conductive charge storage layer. A first dielectric 411 separates the charge storage layer 415 from the body zone 115. A third dielectric 413 separates the charge storage layer 415 from a program electrode 418 and a fourth dielectric 414 may separate the program electrode 418 from the control electrode 420. The program electrode 418 may be electrically connected to a programming pad 450, which may be located in the finalized semiconductor switching device 500. According to another embodiment the program electrode 418 is only temporarily connected to the programming pad 450 during a programming phase. Once programmed, the program electrode 418 may float during the operation of the semiconductor device 500 such that a potential applied to the control electrode 420 is effective in channel portions 115x of the body zones 115. Since the charge storage layer 415 is insulated from surrounding conductive structures even during the program step, no or only a negligible leakage of the stored control charge takes place.

Figure 3A:
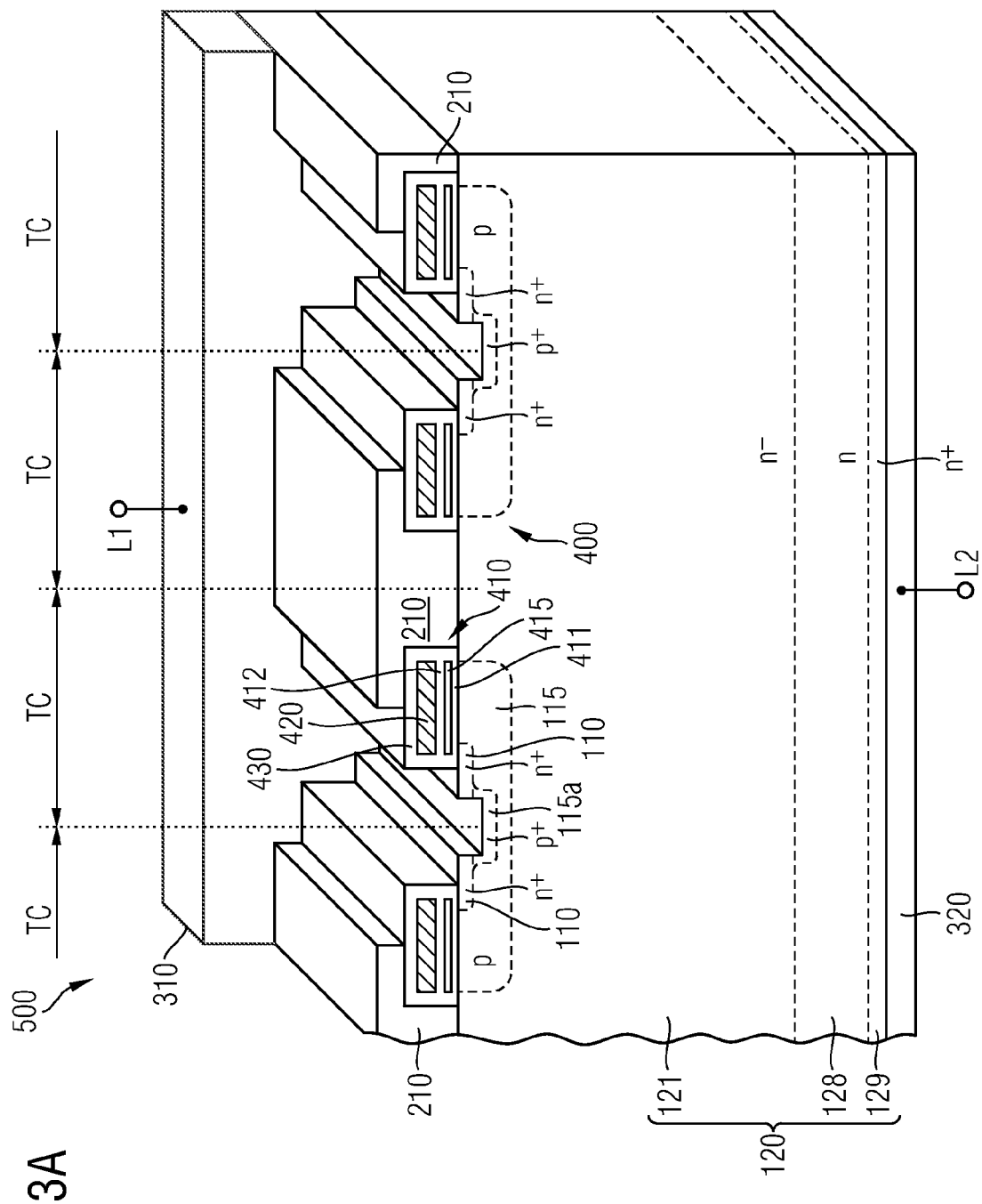
FIG. 3A is a schematic perspective view of a portion of a semiconductor switching device in accordance with an embodiment related to normally-on semiconductor switching devices with planar gate structures.
Figure 3B:
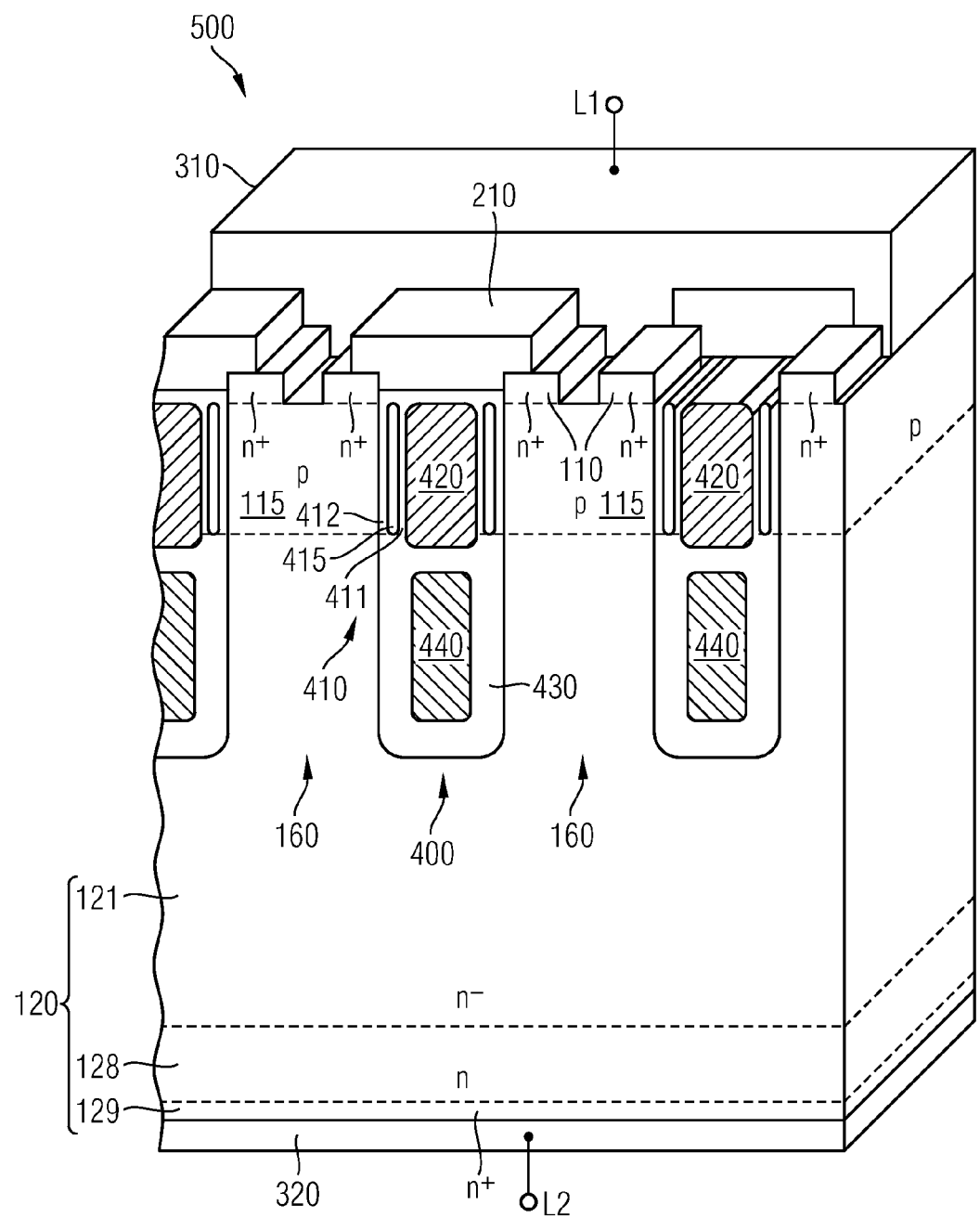
FIG. 3B is a schematic perspective view of a portion of a semiconductor switching device in accordance with an embodiment related to normally-on semiconductor switching devices with trench gate structures.

In FIGS. 3A to 3B, the drain construction 120 includes a comparatively low doped drift zone 121, a heavily doped contact layer 129 directly adjoining the second surface 102 as well as a field stop layer 128 forming a unipolar homo-junction with the drift zone 121. In case the semiconductor body 100 is based on silicon (Si) along the second surface 102 a dopant concentration in an n-type contact layer 129 may be at least $1E18$ cm$^{-3}$, for example at least $5E19$ cm$^{-3}$. A mean impurity concentration in the field stop layer 128 may be at least twice as high as the mean impurity concentration in the drift zone 121 and at most a half of a maximum impurity concentration in the contact layer 129.

A second load electrode 320 may directly adjoin the contact layer 129 along the second surface 102. The second load electrode 320 forms or is electrically connected to the second load terminal L2. The materials of the second load electrode 320 may be selected from the same materials as described for the first load electrode 310. The second load electrode 320 may be the drain electrode of an IGFET.

As regards further details with respect to the control structures 400, the dielectric structure 210 and the first load electrode 310, reference is made to the description of the previous FIGS.

In FIG. 3A the control structures 400 of the semiconductor device 500 are formed as planar structures along the first surface 101 and outside a contour of the semiconductor body 100. The body zones 115 may be based on wells extending from the first surface 101 into the semiconductor body 100. The source zones 110 may be wells extending from the first surface 101 into the wells of the body zones 115.

The transistor cells TC may be stripes extending along a first horizontal direction. Pairs of stripe-shaped transistor cells TC may be symmetrically arranged with respect to a symmetry plane extending in the first horizontal direction along a longitudinal axis of the contact structure 315 that electrically connects the source and body zones 110, 115 of both transistor cells TC. According to other embodiments, the stripe-shaped transistor cells TC are arranged with the same orientation with respect to the first horizontal direction. According to another embodiment the transistor cells TC may be arranged in a two-dimensional periodical pattern, e.g., a square or a hexagonal periodical pattern.

In FIG. 3B the control structures 400 are formed as trench structures extending from the first surface 101 into the semiconductor body 100 such that portions of the semiconductor body 100 between neighboring control structures 400 form semiconductor mesas 160. A vertical extension of the control structures 400 may be equal to or greater than a total vertical extension of the source and body zones 110, 115 whereas pn junctions between body zones 115 and the drain construction 120 are approximately flush with a buried edge of the charge storage structure 410. The control structures 400 may include further portions, for example field electrodes 440 insulated from both the control electrodes 420 and the semiconductor body 100.

The body zones 115 are formed in the semiconductor mesas 160 in the horizontal projection of the control electrodes 420 and charge storage structures 410.

Although the structure depicted in FIG. 3B is similar to the cell construction TC shown in FIG. 2B, cell constructions TC as shown in FIG. 2A, 2C or 2D can also be combined with the vertical structure shown in FIG. 3B according to embodiments.

Figure 3C:
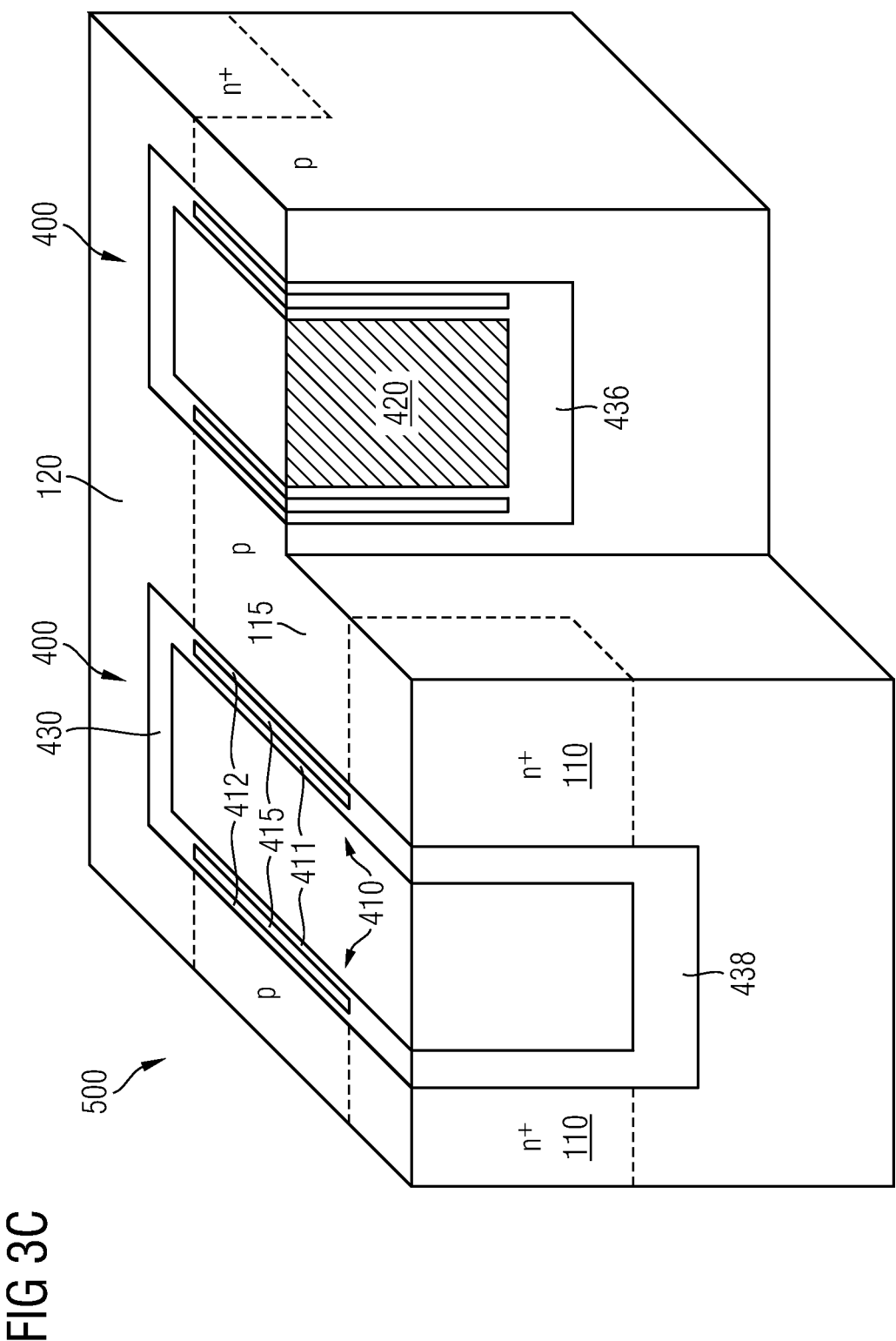
FIG. 3C is a schematic perspective view of a portion of a semiconductor switching device in accordance with an embodiment related to normally-on semiconductor switching devices based on FinFET (fin field effect transistor) cells.

In the transistor cells TC of FIG. 3C the source zones 110 and the drain construction 120 are arranged along a first horizontal direction. In the on-state of the semiconductor device 500 a load current through the body zones 115 flows along the first horizontal direction along both sidewalls of semiconductor fins formed from portions of the semiconductor body 100 between neighboring control structures 400.

Figure 4A:
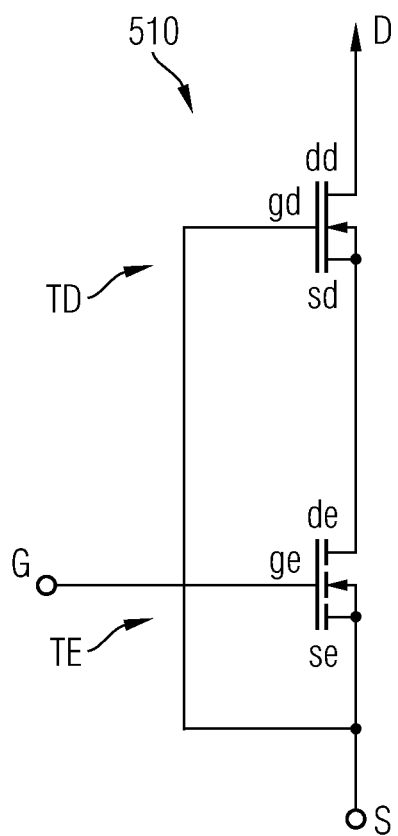
FIG. 4A is a schematic circuit diagram of an electronic circuit including a normally-on semiconductor switching device according to an embodiment.

FIG. 4A refers to an electronic circuit 510 including a virtual depletion transistor TD, which is based on the semiconductor switching device 500 of the previous FIGs., and an enhancement transistor TE in a cascode arrangement.

In the following, the mode of operation of the electronic circuit 510 is described for an n-channel enhancement transistor TE and an n-channel virtual depletion transistor TD with the first conductivity type being the n-type. Equivalent considerations apply for embodiments with p-channel enhancement and depletion transistors.

For switching on the electronic circuit 510 a positive potential is applied to a gate terminal G. The positive potential induces an n-type inversion channel through body zones of the enhancement transistor TE, thereby switching a source potential applied to the source terminal S to a drain electrode de of the enhancement transistor TE. The potential at the drain electrode de of the enhancement transistor discerns only little from the potential at the source terminal S because of a flowing load current. The same potential is applied to a gate gd of the virtual depletion transistor TD. When a potential applied to the gate gd is equal to the potential at the source electrode sd of the virtual depletion transistor, the virtual depletion transistor TD becomes conductive and switches the drain potential of the enhancement transistor TE to the drain electrode dd of the virtual depletion transistor TD and to the drain terminal D of the electronic circuit 510. The series connection of the two transistors TE and TD becomes conductive and allows a load current to flow from the drain terminal D to the source terminal S causing a small voltage drop due to the ohmic resistance of the two transistors TE and TD.

When the potential at the gate terminal G falls below the threshold voltage of the enhancement transistor TE the enhancement transistor TE blocks and the drain potential of the enhancement transistor TE takes a positive potential applied through the drain terminal D by the circuit environment. Since the gate gd of the virtual depletion transistor TD is pinned to the source potential at S, which is lower than the potential at the drain electrode de of the enhancement transistor TE, the gate potential of the virtual depletion transistor TD falls below its threshold voltage and the virtual depletion transistor TD changes also to the blocking state. A blocking voltage applied between S and D divides up among the drain-source paths of both transistors TD, TE.

Using the semiconductor device 500 as virtual depletion transistor allows to benefit from the higher channel conductivity in the virtual depletion transistor TD compared to true depletion transistors. The transistors TD, TE of the electronic circuit 510 may share the same semiconductor die or may be formed from separate semiconductor dies. The transistors TD, TE may be integrated in a housing or on a PCB (printed circuit board) by way of example.

Figure 4B:
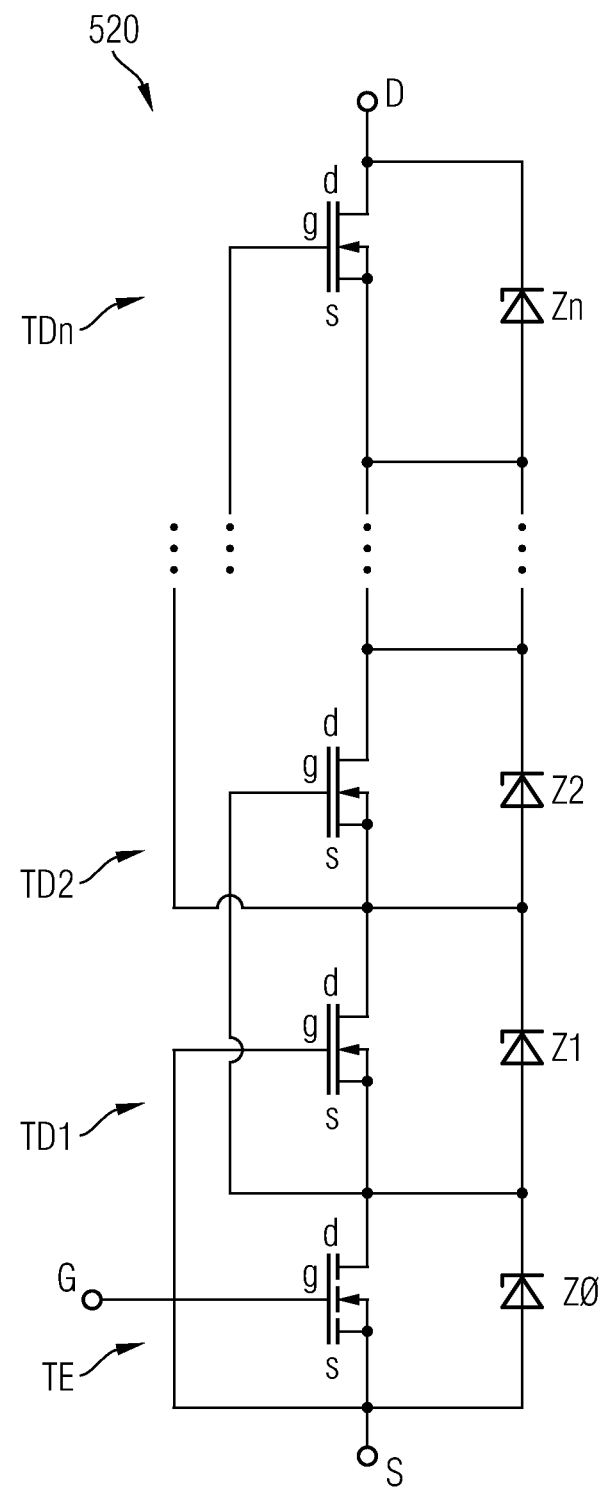
FIG. 4B is a schematic circuit diagram of an electronic circuit including a normally-on semiconductor switching device according to a further embodiment related to cascode circuits.

FIG. 4B shows the circuit diagram of a further semiconductor device 520 with more than one virtual depletion transistors TD1, TD2, . . . , TDn arranged in a cascode configuration including an enhancement transistor TE. A voltage limiting element Z0, Z1, . . . , Zn may be arranged in parallel to each transistor TE, TD1, TD2, . . . , TDn, respectively. According to the embodiment illustrated in FIG. 4B, the voltage limiting elements may be Zener diodes or avalanche diodes. According to another embodiment, the voltage limiting elements may be at least partially realized by the transistor structures TE, TD1, TD2, . . . , TDn themselves.

When the transistors TE, TD1, . . . , TDn are arranged horizontally in a semiconductor body, the number n of virtual depletion transistors TD can be easily adapted to the application requirements, e.g., to the target blocking capability such that devices of different blocking capabilities can be manufactured based on the same layout kernel without expensive grinding and polishing processes thinning the semiconductor body 100.

According to another embodiment, the transistors TE, TD1, TD2, . . . , TDn can be realized as single dies with vertical current flow on a common substrate like a printed circuit board or a ceramic substrate and electrically connected in series connection. A scaling to the desired blocking voltage can be easily done with the number of transistors TD1, TD2, . . . , TDn in series connection. A scaling to the desired load current capability can be easily done by scaling the area of each transistor TE, TD1, TD2, . . . , TDn and/or by paralleling two or more transistors TEa, TEb, TD1a, TD1b, TD2a, TD2b, . . . , TDna, TDnb in each level of the cascode circuit.

Figure 5:
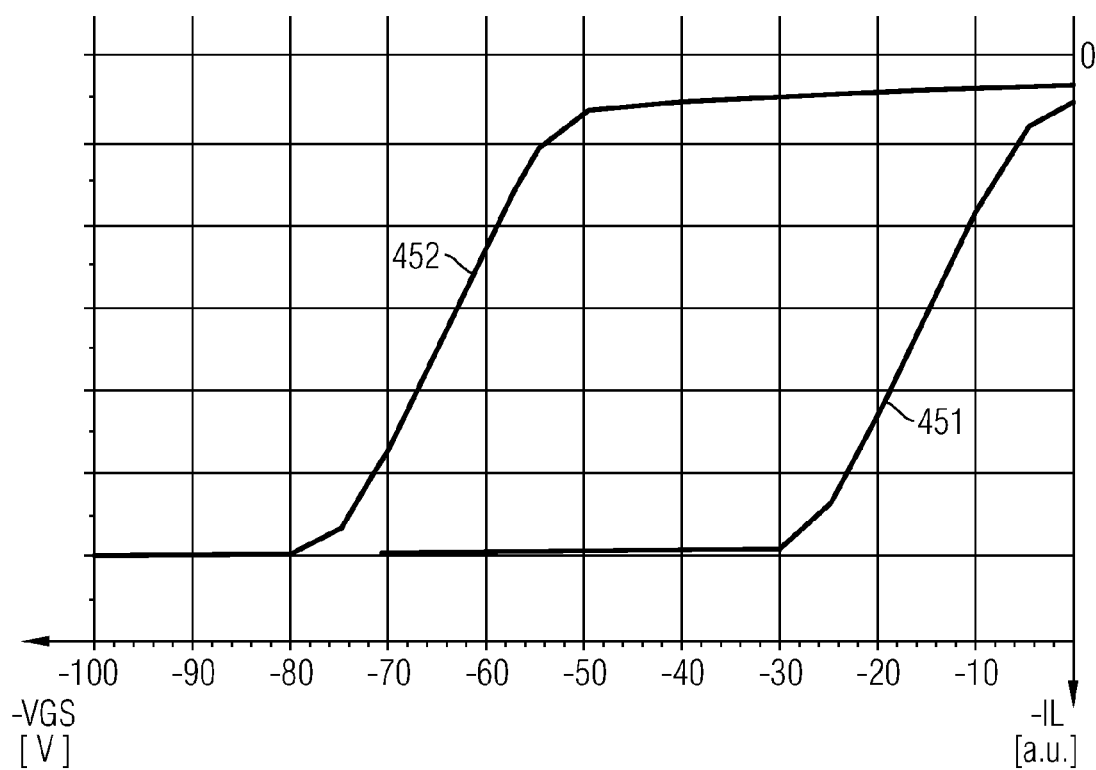
FIG. 5 is a schematic diagram plotting the drain current $I_D$ as a function of the gate-to-source voltage $V_{GS}$ and a control charge on a floating gate for discussing effects of embodiments concerning normally-on semiconductor switching devices.

FIG. 5 schematically illustrates ID/VGS characteristics for different amounts of a control charge on a floating gate with reference to an n-FET design with a nominal blocking voltage of 100 V. ID/VGS characteristic 451 refers to a charge density of 1E12 $Ascm^{-3}$ and ID/VGS characteristic 452 to a charge density of 1E13 $Ascm^{-2}$. With increasing positive control charge, the threshold voltage Vth of the n-FET is shifted to more negative values.

Figure 6:
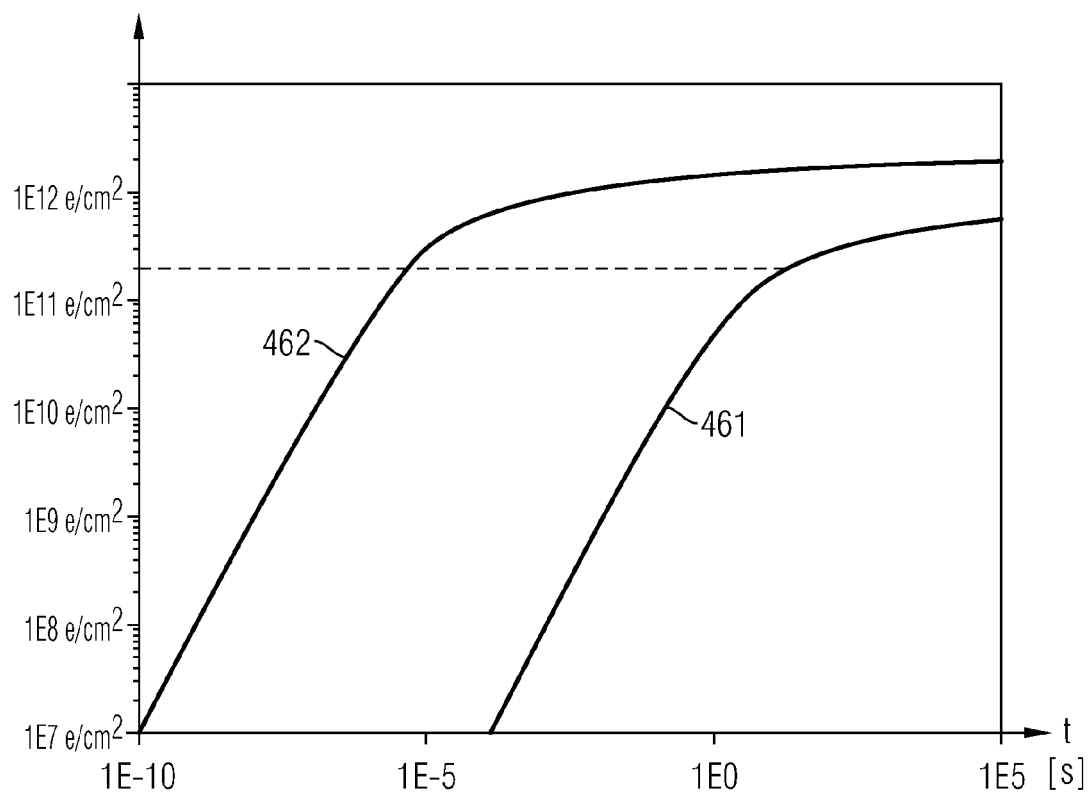
FIG. 6 is a schematic diagram plotting a charge on a floating gate structure as a function of a charging time for discussing effects of embodiments concerning normally-on semiconductor switching devices as well as desaturable semiconductor switching devices.

FIG. 6 shows charging rates 461, 462 for charging a floating gate of a semiconductor switching device. Charging rate 461 refers to a first charging voltage between the control electrode and the body zones and charging rate 462 refers to a second, more negative charging voltage between the control electrode and the body zones.

At the more negative charging voltage it takes around 10 μs to charge the floating gate to a charge density of 4E11 $e/cm^2$ with e representing the elementary charge e=1.6E−19 As. As can be seen from FIG. 6 the charge on the floating gate can be controlled by the applied voltage and the time. Increasing the time will lead to a saturation effect, while the charging voltage has a big influence on the charge stored on the floating gate.

Figure 7A:
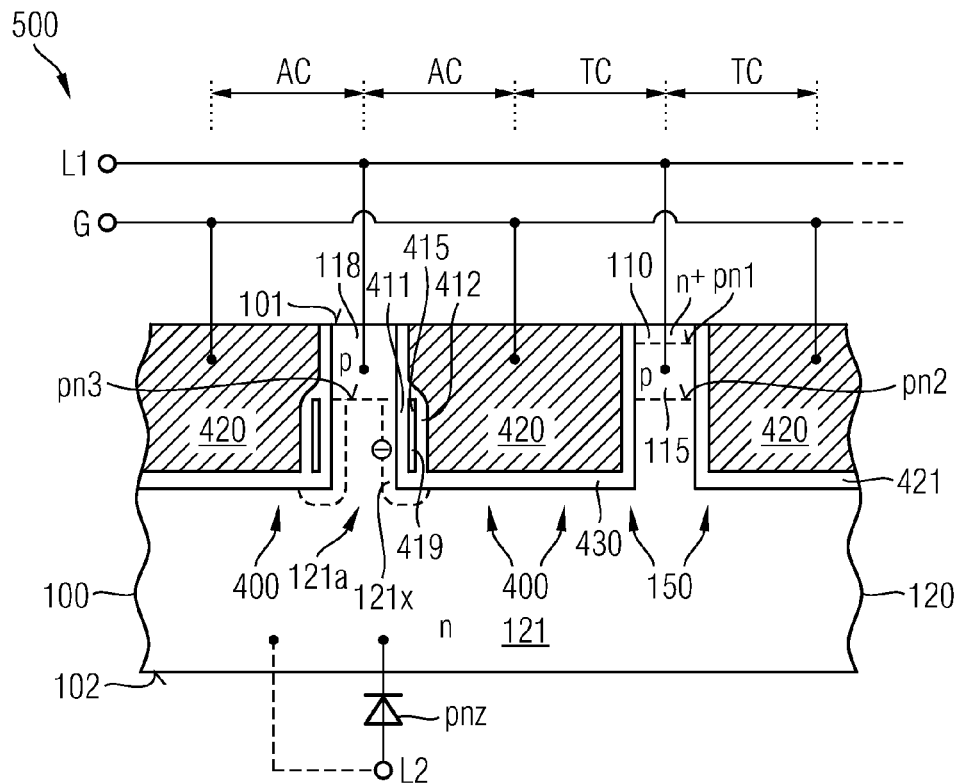
FIG. 7A is a schematic cross-sectional view of a portion of a semiconductor switching device for illustrating effects of embodiments concerning desaturable semiconductor switching devices.
Figure 7B:
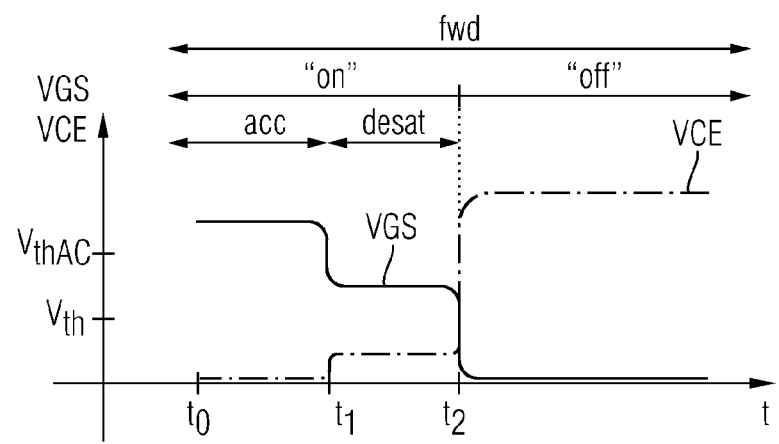
FIG. 7B is a schematic time chart for illustrating a mode of operation of the semiconductor switching device of FIG. 7A.

FIGS. 7A to 7B refer to semiconductor switching devices with transistor cells TC for controlling a load current and with auxiliary cells AC for controlling a charge carrier plasma density during an on-state of the semiconductor device 500.

FIG. 7A shows a portion of a semiconductor switching device 500 that may be an IGBT, for example an RB-IGBT (reverse blocking IGBT), an RC-IGBT (reverse conducting IGBT) or an IGFET. A semiconductor body 100 of the semiconductor device 500 is provided from a single-crystalline semiconductor material, for example silicon (Si), silicon carbide (SiC), germanium (Ge), a silicon-germanium crystal (SiGe), gallium nitride (GaN) or gallium arsenide (GaAs), by way of example.

The semiconductor body 100 has a first surface 101, which may be approximately planar or which may be given by a plane spanned by coplanar surface sections, as well as a mainly planar second surface 102 parallel to the first surface 101.

In a plane perpendicular to the cross-sectional plane the semiconductor body 100 may have a rectangular shape with an edge length in the range of several millimeters. The perpendicular to the first surface 101 defines a vertical direction and directions orthogonal to the vertical direction are horizontal directions.

Transistor cells TC control a load current between a first load terminal L1 and a second load terminal L2. Each transistor cell TC includes a source zone 110 forming a first pn junction pn1 with a body zone 115. The body zones 115 form second pn junctions pn2 with a drain construction 120 including a drift zone 121. In case the semiconductor device 500 is an IGFET, the second load terminal L2 may be electrically connected to the drift zone 121 through a heavily doped contact layer. In case the semiconductor device 500 is an IGBT, the second load electrode L2 is connected with the drift zone 121 through a drain pn junction pnz.

The source and drift zones 110, 121 have a first conductivity type and the body zones 115 have a second, complementary conductivity type. For the illustrated embodiments, the first conductivity type is n-type and the second conductivity type is p-type. Similar considerations as outlined below apply to embodiments with the first conductivity type being p-type and the second conductivity type being n-type.

An impurity concentration in the drift zone 121 may gradually or in steps increase or decrease with increasing distance to the first surface 101 at least in portions of its vertical extension. According to other embodiments the impurity concentration in the drift zone 121 may be approximately uniform. A mean impurity concentration in the drift zone 121 may be between $1E12\ cm^{-3}$ and $1E15\ cm^{-3}$, for example in a range from $5E12\ cm^{-3}$ to $5E13\ cm^{-3}$.

First control structures or gate structures 150 include a first portion of a control electrode 420 that may be electrically connected or coupled to a gate terminal G of the semiconductor device 500. The first control structures 150 control a load current through the transistor cells TC.

The semiconductor switching device 500 further includes auxiliary cells AC for desaturating the drift zone 121 before the semiconductor switching device 500 switches from a conducting mode to a blocking mode. Each auxiliary cell AC includes a charge carrier transfer zone 118 forming a third pn junction pn3 with desaturation portions 121a of the drift zone 121. The charge carrier transfer zones 118 are electrically connected to the first load terminal L1.

According to an embodiment, the auxiliary cells AC are devoid of source zones and typically do not form pn junctions with further doped zones that are electrically connected to the first load terminal L1. According to other embodiments, the auxiliary cells may also include source zones 110. The body and charge carrier transfer zones 115, 118 may have the same lateral and/or vertical extensions and may have approximately the same main net impurity concentration.

Second control structures 400 include second portions of the control electrode 420. In an on state of the transistor cells TC a suitable potential applied to the control electrode 420 induces n-type inversion channels in the body zones 115, wherein the inversion channels extend from the source zones 110 to the drift zone 121. In an off state of the auxiliary cells AC a suitable potential applied to the control electrode 420 prevents the formation of p-type inversion layers in the desaturation portions 121a such that no holes are drained off from the drift zone 121 to the first load terminal L1.

The second control structures 400 include charged layers 415 which are sandwiched between the control electrode 420 and the desaturation portions 121a, respectively. A charged layer 415 contains a control charge 419 that induces a permanent negative bias between the control electrode 420 and the desaturation portions 121a. As long as a voltage VGS applied between the gate terminal G and the first load electrode L1 does not exceed a threshold voltage VthAC of the auxiliary cells AC the control charge 419 induces p-type inversion layer 121x in the desaturation portions 121a of the drift zone 121.

The charged layer 415 may be a conductive layer consisting of or including a heavily doped polycrystalline layer. According to an embodiment, the charged layer 415 is a dielectric trapping layer, for example a silicon nitride layer. A first dielectric 411 may separate the charged layer 415 from the desaturation portions 121a. A second dielectric 412 may separate the charged layer 415 from the control electrode 420 of the respective control structure 400. The first and second dielectrics 411, 412 may be silicon oxide layers, for example TEOS (tetraethyl orthosilicate) layers resulting from the deposition of a silicon oxide using TEOS as precursor material. The control structures 400 may further include a separation dielectric 430 separating the control electrode 420 from further portions of the semiconductor body 100. The control electrode 420 may be provided from a heavily doped polycrystalline silicon material and may include metal-containing layers. The charged layer 415 may be exclusively formed sandwiched between the control electrode 420 and the desaturation portion 121a or may also overlap with the body zones 115, respectively.

The amount of charge trapped on the charged layer 415 may be selected such that the inversion layers 121x in the desaturation portions 121a of the drift zone 121 can be switched on and off during the on-state of the semiconductor switching device 500, in which the transistor cells TC are conductive and n-type inversion channels 115 are formed through the body zones 115.

Beyond VthAC, VGS fully compensates for the negative control charge 419 such that no inversion layers 121x are formed. A charge carrier plasma density in the drift zone 121 remains unaffected. Below the threshold voltage VthAC of the auxiliary cells AC, VGS does not sufficiently compensate for the negative control charge 419. The uncompensated negative control charge 419 induces p-type inversion layers 121x through which holes dissipate to the first load terminal L1. The charge carrier plasma density is reduced. For Vth<VGS<VthAC the semiconductor switching device 500 is "on" and desaturates. For VGS<Vth, the semiconductor switching device 500 is "off", wherein the p-type inversion layers 121x have no or only marginal negative impact on the blocking capabilities.

The auxiliary cells AC may change from a non-inversion state without p-type inversion layers 121x in the drift zone 121 to an inversion state with p-type inversion layers 121x in the drift zone 121 without affecting the operation of the transistor cells TC.

According to the illustrated embodiment referring to n-channel IGBTs or n-channel IGFETs, the threshold voltage VthAC is above the threshold Vth of the transistor cells TC. For example, VthAC may be in a range from 10V to 12V and Vth may be in a range from 6V to 8V.

The timing diagram in FIG. 7B shows a high plasma density state or accumulation state between t0 and t1, when the voltage of the gate signal VGS is above both the threshold voltage Vth of the transistor cells TC and the threshold voltage VthAC of the auxiliary cells AC. In a desaturation period between t1 and t2 the VGS is below the threshold voltage VthAC of the auxiliary cells AC but above the threshold voltage Vth of the transistor cells TC. The transistor cells TC remain in the on-state while p-type inversion layers around the control structures 180 of the auxiliary cells AC desaturate the drift zone 121. At t2 the voltage of the gate signal VGS can directly transit from a voltage between the two threshold voltages Vth, VthAC to below the threshold voltage Vth, thereby switching off the transistor cells TC. The desaturation period reduces the charge in the drift zone 121 right before the semiconductor switching device 500 of FIG. 7A is switched off. The desaturation significantly reduces switching losses.

The auxiliary cells AC may be operated as desaturation cells actively draining off charge carriers from the drift zone 121 through the first load terminal L1 prior to a turn-off signal applied to the gate terminal G semiconductor switching device 500.

FIGS. 8A to 8E refer to details of the auxiliary cells AC including the charged layer 415. A first load electrode 310 may be electrically connected or coupled to the first load terminal L1. The first load electrode 310 may be the source electrode of an n-IGFET or the emitter electrode of an n-IGBT, by way of example. The first load electrode 310 may consist of or contain, as main constituent(s) aluminum (Al), copper (Cu), or alloys of aluminum or copper, for example AlSi, AlCu or AlSiCu. According to other embodiments the first load electrode 310 may contain, as main constituent(s), nickel (Ni), titanium (Ti), tungsten (W), tantalum (Ta), vanadium (V), silver (Ag), gold (Au), platinum (Pt) and/or palladium (Pd). For example, the first load electrode 310 may include two or more sublayers, e.g., a silicide, a conductive nitride and/or a metal alloy.

A dielectric structure 210 may insulate the first load electrode 310 from the control electrode 420 which may be electrically coupled or connected to the gate terminal G of the semiconductor device 500. The dielectric structure 210 may include one or more dielectric layers from silicon oxide, silicon nitride, silicon oxinitride, doped or undoped silicon glass, for example BSG (boron-silicate glass), PSG (phosphorus-silicate glass), or BPSG (boron-phosphorus-silicate glass), by way of example.

Contact structures 315 may extend through openings of the dielectric structure 210 and may electrically connect the first load electrode 310 with the charge transfer zones 118 and may electrically connect the first load electrode 310 with the charge carrier transfer zones 118. The charge carrier transfer zones 118 may include heavily doped contact portions 118a that ensure an ohmic contact between the contact structure 315 and the charge carrier transfer zones 118.

The semiconductor device 500 of FIG. 8A further includes a barrier zone 125 forming a portion of the drain construction 120. The barrier zone 125 may be formed within the charge carrier transfer zone 118 and at a distance to the desaturation portions 121a of the drift zone 121. According to other embodiments, the barrier zone 125 may be formed within the drift zone 121 at a distance to the charge carrier transfer zone 118. According to the illustrated embodiment, the barrier zone 125 is formed along the interface between the charge carrier transfer zone 118 and the desaturation portions 121a of the drift zone 121. The barrier zone 125 increases a potential barrier for holes in an on state of the semiconductor device 500 such that less charge carriers leak from a charge carrier plasma in the drift zone 121 in the on-state of the semiconductor device 500.

The charged layer 415 extends at least along the barrier zone 125 such that at least the potential barrier formed by the barrier zone 125 is by-passed in the desaturation mode of the semiconductor device 500. The charged layer 415 may further extend along at least portions of the drift zone 121 and/or the charge carrier transfer zone 118. The charged layer 415 may be a dielectric trapping layer based on a silicon nitride layer. The first and second dielectric layers 411, 412 may be silicon oxide layers. The control charge 419 is trapped on the charged layer 415, which may be charged in a program step using Fowler-Nordheim tunneling or hot electron injection, by way of example.

For example, a program voltage may be applied between the gate terminal G and the first load terminal L1 such that electrons may directly tunnel from either the control electrode 420 or semiconductor body 100 onto the charged layer 415. According to another embodiment, a first program voltage may be applied between the first and second load terminal L1, L2 such that electrons are accelerated in the charge carrier transfer zone 118 between the first electrode 310 and the desaturation portions 121a of the drift zone 121 and a second program voltage may be applied to the control electrode 420 to deflect the accelerated electrons such that they reach the charged layer 415. That one of the first and second dielectrics 411, 412 through which the electrons reach the charged layer 415 is effective as the tunnel dielectric. The tunnel dielectric may be thinner than the gate dielectric in the transistor cells TC such that tunneling may be controlled to take place only in the auxiliary cells AC.

The semiconductor device 500 of FIG. 8B includes a charged layer 415 which is based on a conductive charge storage layer. A first dielectric 411 separates the charged layer 415 from the semiconductor body 100 and a second dielectric 412 insulates the charged layer 415 from the control electrode 420.

The charged layer 415 may be or may contain a heavily doped polycrystalline semiconductor material and may be charged by using Fowler-Nordheim tunneling, a hot electron injection as described above with regard to FIG. 8A.

According to another embodiment, a wiring structure may electrically connect the charged layers 415 with a programming pad 450 which may be formed on the semiconductor body 100 of the finalized semiconductor switching device 500. According to a further embodiment, the wiring structure may connect the charged layers 415 with each other and temporarily, during a manufacturing phase, with a programming pad 450 outside the semiconductor body 100 of the finalized semiconductor device 500, for example in a kerf area of a semiconductor wafer from which the semiconductor bodies 100 of a plurality of identical semiconductor switching devices 500 are obtained. After formation of the transistor cells TC a program step temporarily connects a charge source with the programming pad 450 until the control charge is applied to the conductive charged layer 415. Then the semiconductor device 500 is separated from the structure including the programming pad 450 and an interruption of the wiring structure between the charged layer 415 and the programming pad 450 may be sealed at the device side. As a result, the charge is trapped on the conductive and completely insulated charged layer 415.

Figure 8C:
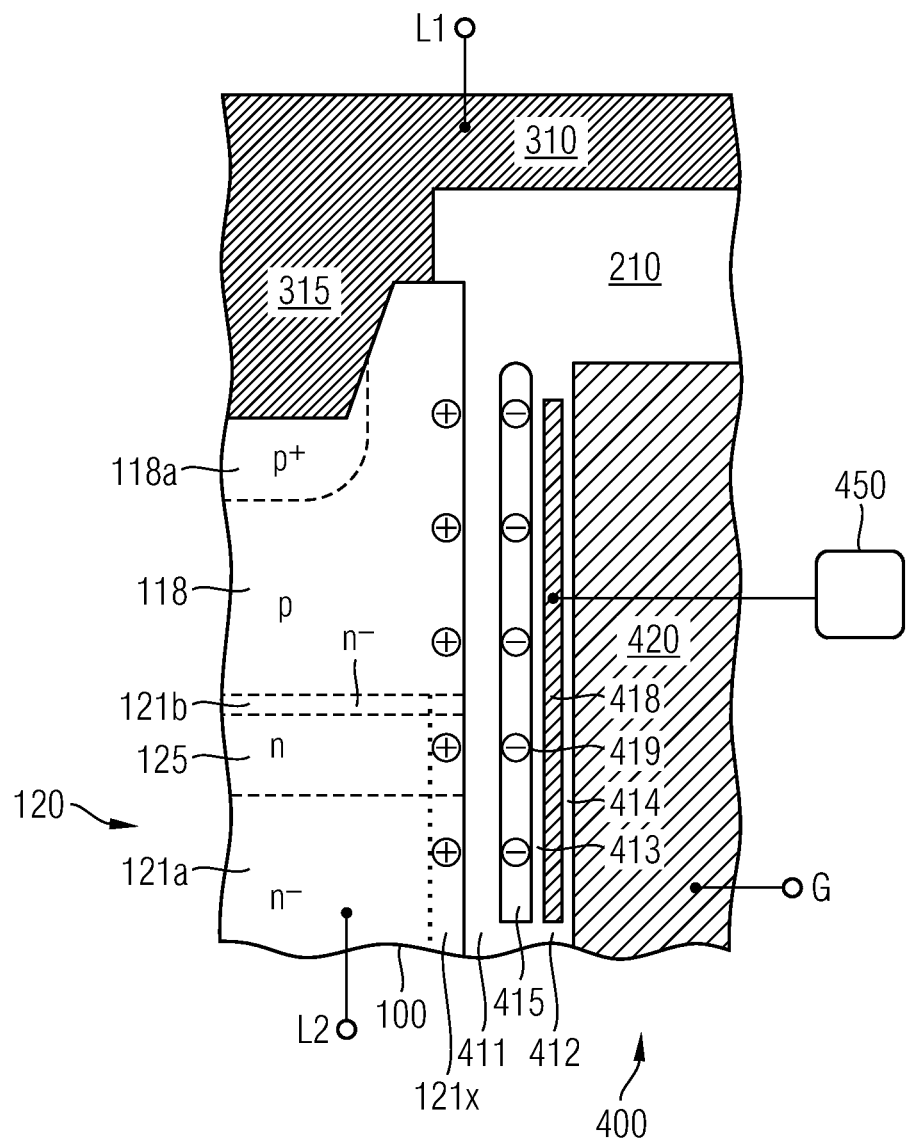
FIG. 8C is a schematic cross-sectional view of a portion of a semiconductor switching device in accordance with an embodiment related to desaturable semiconductor switching devices including a program electrode.

In FIG. 8C, the charged layer 415 includes a dielectric charge trapping layer or a conductive charge storage layer and a first dielectric 411 separates the charged layer 415 from the semiconductor body 100. A third dielectric 413 separates the charged layer 415 from a program electrode 418 and a fourth dielectric 414 may separate the program electrode 418 from the control electrode 420. The program electrode 418 may be electrically connected to a programming pad 450 which may be located in the finalized semiconductor switching device 500 or outside, as described above. Once programmed, the program electrode 418 may float during the operation of the semiconductor device 500 such that a potential applied to the control electrode 420 is effective onto desaturation portions 121a of the drain construction 120. Since the charged layer 415 is insulated from surrounding conductive structures even during the program step, no or only a neglectable amount of the stored control charge 419 leaks from the charged layer 415 during operational lifetime of the semiconductor switching device 500.

As regards control structures extending from a first surface 101 into a semiconductor body 100 of a semiconductor device 500, first and second dielectrics 411, 412 as well as the charged layer 415 may be realized as parts of a main trench structure, wherein the main trench structures are arranged in a regular pattern. According to another embodiment, at least the first dielectric 411 and the charged layer 415 may be formed outside the main trench structures. For example, the first dielectric 411 and the charged layer 415 may be formed in secondary trenches formed between semiconductor mesas including the charge carrier transfer zones 118 on the one hand and main trench structures on the other hand.

According to FIG. 8D the first dielectric 411 and the charged layer 415 are formed in a secondary trench structure AT between a semiconductor mesa SM and a main trench structure MT. The secondary trench structure AT may be formed on the basis of a secondary trench formed between the semiconductor mesa SM and the finalized main trench structure MT.

Figure 8E:
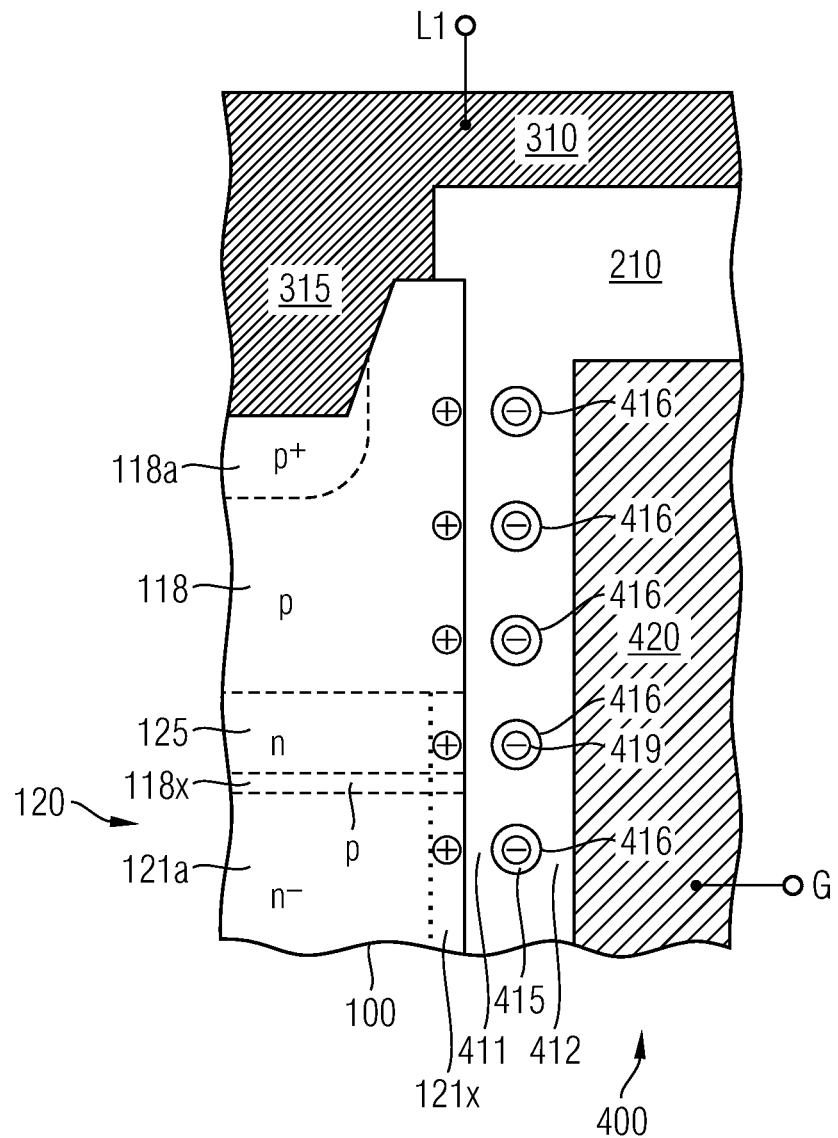
FIG. 8E is a schematic cross-sectional view of a portion of a semiconductor switching device in accordance with an embodiment related to a charged layer formed from embedded silicon nanocrystallites.

The semiconductor device 500 of FIG. 8E includes a charged layer 415 based on semiconducting nanocrystallites 416 provided from silicon or germanium and embedded in a dielectric layer, e.g. a semiconductor oxide such as a silicon oxide layer. The charged layer 415 based on nanocrystallites 416 may be formed by introducing main trenches from the first surface 101 into the semiconductor body 100. A semiconductor oxide, for example a silicon oxide is formed on an exposed sidewall of the semiconductor mesa to form the first dielectric 411 and a substrate layer for the charged layer 415. Then silicon and/or germanium may be implanted into at least a section of the semiconductor oxide layer. The implanted semiconductor oxide layer is annealed, for example at temperatures of at least 1000 degree Celsius for at least 10 seconds to form nanocrystallites 416 within the implanted portions of the semiconductor oxide. According to another embodiment, a semiconductor oxide layer, for example a silicon or germanium containing oxide layer may be deposited at a high content of germanium and/or silicon atoms. According to yet a further embodiment, a non-contiguous polycrystalline silicon or germanium layer may be deposited. After forming the silicon or germanium containing layer the second dielectric 412, for example a further semiconductor oxide such as silicon oxide or germanium oxide may be deposited onto the layer with the high content of semiconducting material. The layer with the high silicon content may line the complete main trench. According to other embodiments, first a control dielectric 421 may line the main trenches and a first portion of a control electrode 420 is formed in a bottom portion of the main trenches. Then a silicon-rich layer is deposited and covered by a further oxide spacer forming the second dielectric.

Figure 8F:
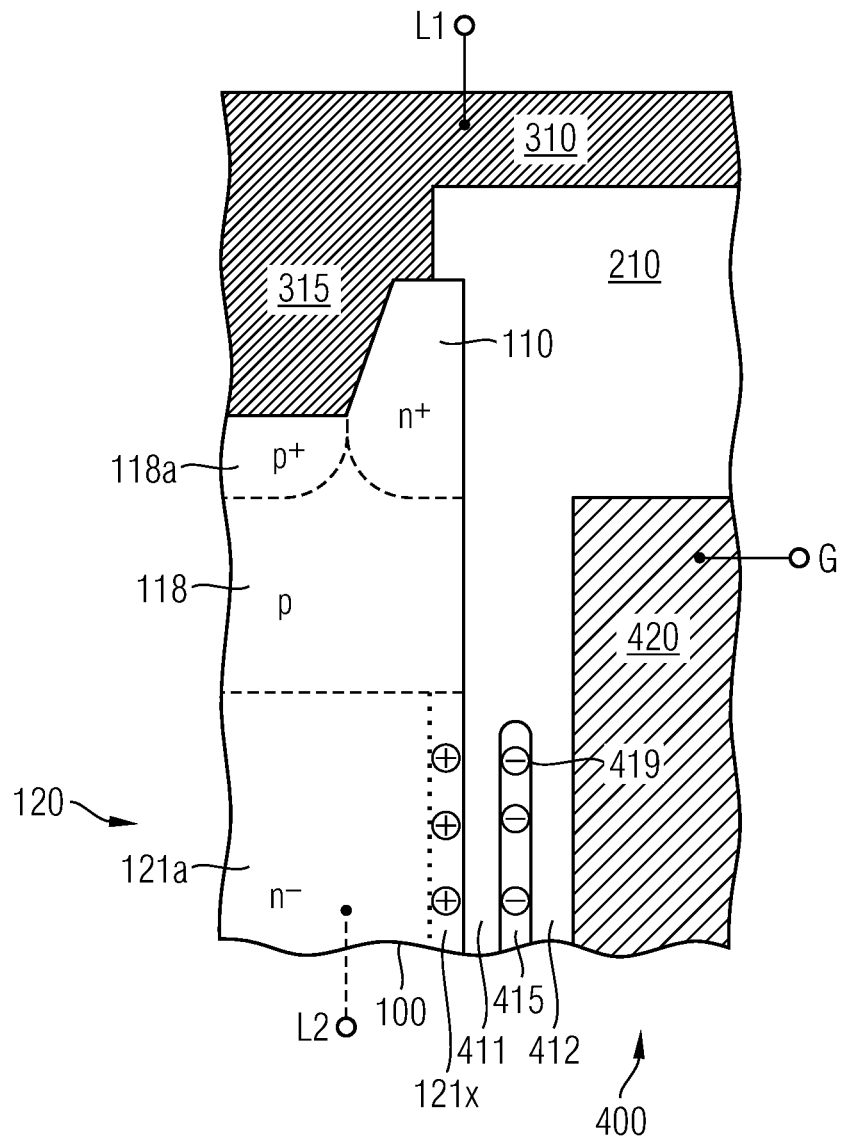
FIG. 8F is a schematic cross-sectional view of a portion of a semiconductor switching device in accordance with an embodiment related to a combined auxiliary/transistor cell.

FIG. 8F refers to combined auxiliary/transistor cells including a source zone 110 electrically connected to the first load electrode 310 and forming a pn junction with the charge carrier transfer zone 118, which is also effective as a body zone through which an inversion channel is formed in the on state of the semiconductor device 500.

The charged layer 415 does not overlap with the charge carrier transfer zone 118 and may be spaced from the charge carrier transfer zone 118 along the vertical direction. The drift zone 121 may directly adjoin the charge carrier transfer zone 118. The inversion layer 115x in the drift zone 121 may be switched on and off while the inversion channel through the charge carrier transfer zone 118 remains "on".

FIGS. 9A and 9B refer to vertical semiconductor switching devices based on the concept of the semiconductor switching device 500 of FIG. 7A. First and second load electrodes 310, 320 arranged on opposite sides of the semiconductor body 100. A minimum distance between the first and second surfaces 101, 102 is selected to achieve a specified voltage blocking capability of the semiconductor device 500. For example, the distance between the first and second surfaces 101, 102 may be 90 µm to 110 µm for an IGBT specified for a blocking voltage of about 1200 V. Other embodiments related to PT-IGBTs (punch through IGBTs) or IGBTs with high blocking capabilities may provide semiconductor bodies 100 with a thickness of several 100 µm.

The drain construction 120 includes barrier zones 125, some or all of them sandwiched between the charge carrier transfer zones 118 and the drift zone 121. The barrier zones 125 may form pn junctions with the charge carrier transfer zones 118 and unipolar homojunctions with the drift zone 121. A mean impurity concentration in the barrier zones 125 is at least ten times as high as a mean impurity concentration in the drift zone 121. According to an embodiment, the mean impurity concentration in the barrier zones 125 may range from $1E16\ cm^{-3}$ to $1E18\ cm^{-3}$, for example from $1E17\ cm^{-3}$ to $5E17\ cm^{-3}$. The dopants of the barrier zones 125 may be phosphorus (P), arsenic (As), selenium (Se) and/or sulfur (S) atoms/ions.

The drain construction 120 of the IGBT 530 of FIG. 9A further includes a contact layer 129 of the second conductivity type, which directly adjoins the second load electrode 320. The second load electrode 320 may form or may be electrically connected to a collector terminal C forming the second load terminal. A maximum impurity concentration for the p-type contact layer 129 of FIG. 9A may be at least $1E16\ cm^{-3}$, for example at least $5E17\ cm^{-3}$. A field stop layer 128 may form a pn junction with the contact layer 129 and a unipolar homojunction with the drift zone 121. A mean dopant concentration in the field stop layer 128 may be at least five times as high as in the drift zone 121 and at most a fifth of that in the contact layer 129. The drain construction 120 may include further impurity zones, for example floating counter-doped islands or a superjunction structure.

Idle cells IC separate pairs of auxiliary cells AC from pairs of transistor cells TC. The auxiliary cells AC of each pair are formed on opposing sides of a control structure 400 extending from the first surface 101 into a semiconductor body 100. A layer stack including the first dielectric 411, the charged layer 415 and the second dielectric 412 is sandwiched between the control electrode 420 and the surrounding portions of the semiconductor body 100. The charged layer 415 may be one contiguous layer formed on all sides of the control structure 400 including the bottom tip. According to other embodiments, the charged layer is formed only along at least the vertical sidewalls and is absent at least in a region along the bottom of the control structure 400. The inversion layers 121x induced in desaturation portions 121a of the drift zone 121 by the control charge on the charged layer 415 enclose the portions of the second control structures 400 extending through the barrier zone 125 into the drift zone 121. One, two, three or more field electrode structures 170 may be formed between each control structure 420 assigned to the auxiliary cells AC and gate structures 150 assigned to the transistor cells TC. The field electrode structures 170, the gate structures 150 as well as the second control structures 400 may have the same vertical extension and/or the same lateral cross-sectional area. The cross-sectional areas of each of the second control structures 400, gate structures 150 and field electrode structures 170 may be polygons, for example squares or rectangles with or without rounded corners, ovals, circles or rings. According to other embodiments, the control structures 400, the field electrode structures 170 and the gate structures 150 are stripe-shaped and form a regular stripe pattern.

First portions of the control electrode 420 included in the gate structures 150 and second portions of the control electrode 420 in the second control structures 400 are electrically coupled or connected to the gate terminal G. Field dielectrics 171 electrically separate a field electrode 175 from the semiconductor body 100. The field electrodes 175 may float or may be electrically connected to the potential of one of the load electrodes. For example, the field electrodes 175 may be electrically connected to the emitter terminal E.

The IGFET 540 of FIG. 9B is also based on the concept of the semiconductor switching device 500 of FIG. 7A. The charged layer 415 is formed along the sidewalls of the control structure 400 and is absent in a bottom portion to reduce gate-to-collector capacitance $C_{GD}$. A contact layer 129 of the first conductivity type is effective as a drain layer. The first load terminal provides a source terminal S and the second load terminal provides a drain terminal D. As regards further details, reference is made to the description of FIG. 9A.

Figure 10A:
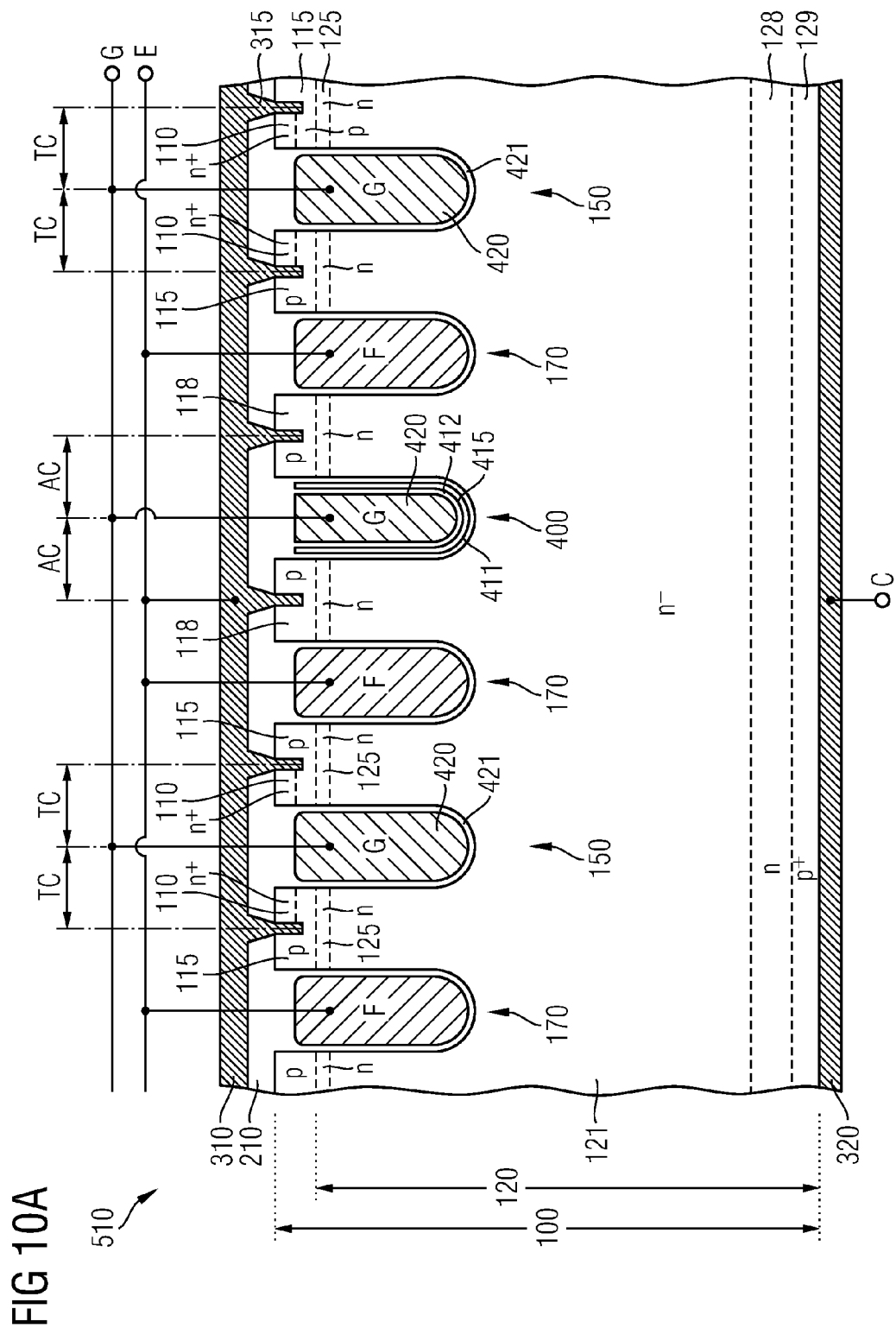
FIG. 10A is a schematic cross-sectional view of a portion of a semiconductor switching device in accordance with an embodiment related to a layout with pairs of transistor cells and pairs of auxiliary cells separated by field electrodes.

According to the embodiment illustrated in FIG. 10A, second control structures 400 and gate structures 150 alternate with each other, wherein at least one, for example two, three or more, field electrode structure 170 are arranged between neighboring second control and gate structures 400, 150.

The semiconductor device 510 of FIG. 10B is based on a layout without field electrode structures. First semiconductor mesas 160a with source zones 110 alternate with second semiconductor mesas 160b without source zones 110. Charged layers 415 are only formed along the second semiconductor mesas 160b. Second control structures 400 face each other at opposing sides of an intermediate second semiconductor mesa 160b. Gate structures 150 face each other on opposing sides of intermediate first semiconductor mesas 160a. Second control structures 400 and gate structures 150 share the same main trenches.

FIG. 10C refers to an embodiment with all charged layers 415 formed on the same side of main trench structures. For example, after forming the main trench structures and the control dielectrics, silicon and/or germanium atoms may be implanted at an implant angle tilted to the perpendicular such that the intermediate semiconductor mesas 160 shadow the implant beam. The source zones 110 are formed only in the halves of the semiconductor mesas 160 averted from the control structure 400 and facing the respective gate structure.

Figure 11:
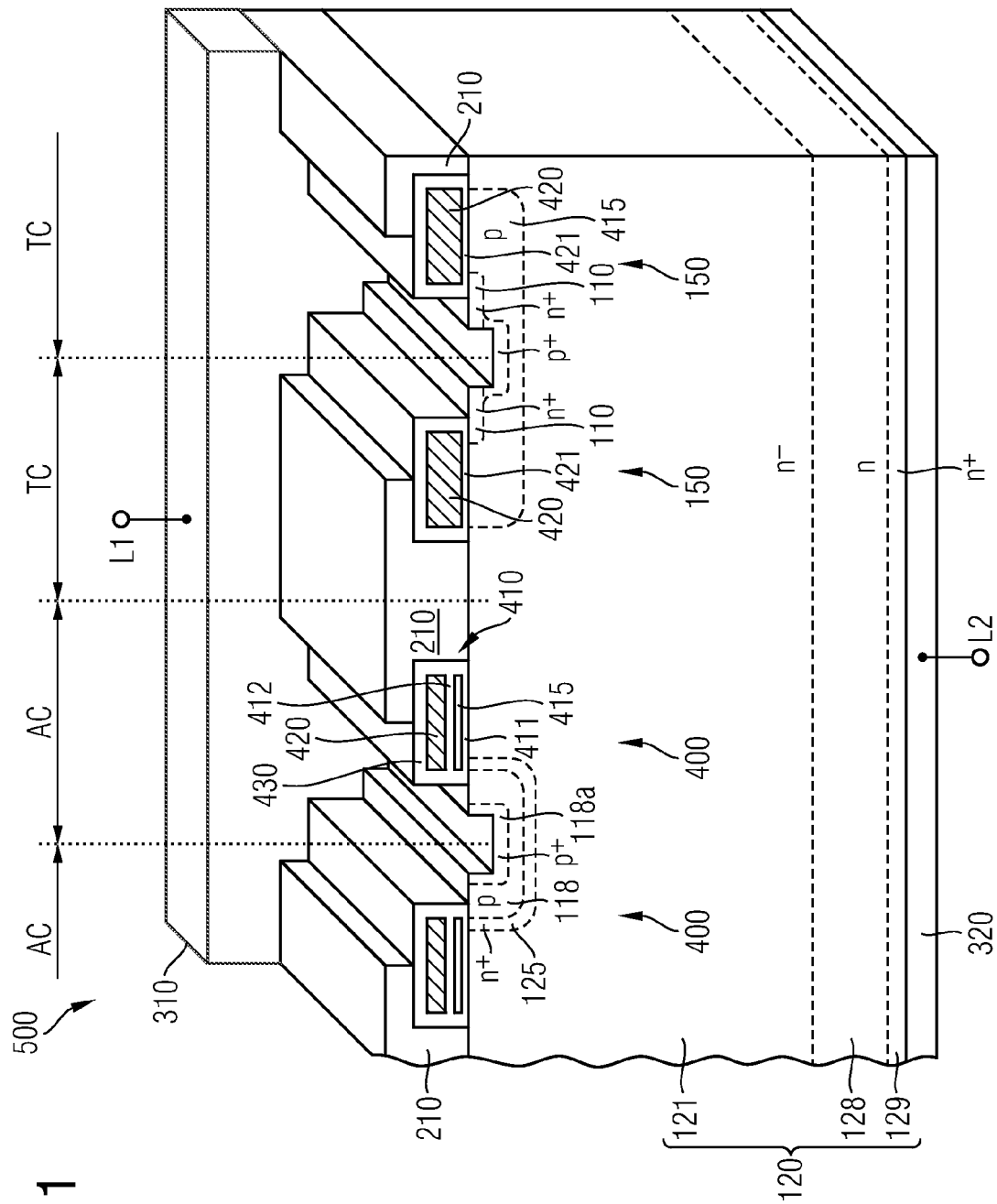
FIG. 11 is a schematic cross-sectional view of a portion of a semiconductor switching device in accordance with an embodiment related to planar control structures.

FIG. 11 refers to an embodiment with planar second control and gate structures 400, 150. The lateral extension of the charge carrier transfer zones 118 may be smaller than that of the body zones 115 such that the second control structures 400 overlap with portions of the drift zone 121.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a first load terminal electrically connected to source zones of transistor cells, wherein the source zones form first pn junctions with body zones;
   a second load terminal electrically connected to a drain construction forming second pn junctions with the body zones; and
   control structures directly adjoining the body zones, the control structures comprising a control electrode and charge storage structures, the control electrode configured to control a load current through the body zones, the charge storage structures insulating the control electrode from the body zones and containing a control charge adapted to induce inversion channels in the body zones in the absence of a potential difference between the control electrode and the first load terminal,
   wherein the body zones are formed in semiconductor mesas formed from portions of a semiconductor body and separated from each other by the control structures.

2. The semiconductor device of claim 1, wherein the charge storage structures are sandwiched between the control electrode and at least the body zones.

3. The semiconductor device of claim 1, wherein the charge storage structures are charged portions of a control dielectric that separates the control electrode from a semiconductor body including the body zones.

4. The semiconductor device of claim 1, wherein the charge storage structures comprise charge storage layers, first dielectrics sandwiched between the body zones and the charge storage layers, and second dielectrics sandwiched between the charge storage layers and the control electrode.

5. The semiconductor device of claim 4, wherein the charge storage layers comprise a conductive material.

6. The semiconductor device of claim 5, further comprising:
   a wiring structure connecting the charge storage layers with a programming pad.

7. The semiconductor device of claim 4, wherein the charge storage layers comprise dielectric charge trapping layers.

8. The semiconductor device of claim 4, wherein the first dielectric is thicker than the second dielectric.

9. The semiconductor device of claim 4, further comprising:
   program electrodes sandwiched between the control electrode and the charge storage layers.

10. The semiconductor switching device of claim 1, wherein the charged layer is a dielectric structure embedding semiconducting nanocrystallites.

11. A semiconductor switching device, comprising:
    transistor cells comprising source zones forming first pn junctions with body zones, the body zones forming second pn junctions with a drain construction;

auxiliary cells comprising charge carrier transfer zones forming third pn junctions with desaturation portions of the drain construction;
  a first control structure comprising a first portion of a control electrode and configured to induce an inversion channel through the body zones in an on state;
a second control structure directly adjoining the desaturation portions, the second control structure comprising a second portion of the control electrode and a charged layer sandwiched between the second portion of the control electrode and the desaturation portions and containing a control charge adapted to induce an inversion layer in the desaturation portions in the on state.

12. The semiconductor switching device of claim 11, wherein the control charge is adapted to induce the inversion layer in the desaturation portions at a first gate voltage applied between the control electrode and the source zones in the on state and to induce no inversion layer in the desaturation portions at a second gate voltage applied between the control electrode and the source zones in the on state.

13. The semiconductor switching device of claim 11, further comprising:
  a first load terminal electrically connected to the source zones, the body zones and the charge carrier transfer zones, and
  a second load terminal electrically connected to the drain construction.

14. The semiconductor switching device of claim 11, wherein the source zones, the body zones and the charge carrier transfer zones are formed in semiconductor mesas formed from portions of a semiconductor body, and the control structures separate neighboring ones of the semiconductor mesas.

15. The semiconductor switching device of claim 11, further comprising:
  a first dielectric sandwiched between the semiconductor body and the charged layer, and a second dielectric sandwiched between the charged layer and the control electrode.

16. The semiconductor switching device of claim 11, wherein the charged layer is a conductive layer.

17. The semiconductor switching device of claim 16, further comprising:
  a wiring structure connecting the charged layer with a programming pad.

18. The semiconductor switching device of claim 11, wherein the charged layer is a dielectric charge trapping layer.

19. The semiconductor switching device of claim 11, wherein the first dielectrics are thicker than the second dielectrics.

20. The semiconductor switching device of claim 11, wherein the drain construction includes barrier zones and a drift zone, a mean net dopant concentration of the barrier zones exceeds at least five times a mean net dopant concentration in the drift zone and the charge storage structure is sandwiched between the control electrode and at least some of the barrier zones.

21. The semiconductor switching device of claim 11, wherein the charged layer is a dielectric structure embedding semiconducting nanocrystallites.

22. The semiconductor switching device of claim 11, wherein the auxiliary cells are devoid of doped zones that are both electrically connected to the first load terminal and form pn junctions with the charge carrier transfer zones.

* * * * *